United States Patent [19]
Yamazaki et al.

[11] Patent Number: 6,134,178
[45] Date of Patent: Oct. 17, 2000

[54] SYNCHRONOUS SEMICONDUCTOR MEMORY DEVICE SUITABLE FOR MERGING WITH LOGIC

[75] Inventors: Akira Yamazaki; Shigeki Tomishima, both of Hyogo, Japan

[73] Assignee: Mitsubishi Denki Kabushiki Kaisha, Tokyo, Japan

[21] Appl. No.: 09/229,265

[22] Filed: Jan. 13, 1999

[30] Foreign Application Priority Data

Jul. 29, 1998 [JP] Japan .................................. 10-213998

[51] Int. Cl.[7] .................................................. G11C 8/00
[52] U.S. Cl. .............. 365/233; 365/189.05; 365/230.08; 365/230.03
[58] Field of Search ......................... 365/189.08, 189.05, 365/230.03, 194, 230.06, 230.08, 233

[56] References Cited

U.S. PATENT DOCUMENTS

| | | | |
|---|---|---|---|
| 5,831,924 | 11/1998 | Nitta et al. .......................... | 365/230.03 |
| 5,892,730 | 4/1999 | Sato et al. ............................... | 365/233 |
| 5,926,434 | 7/1999 | Mori .......................................... | 365/233 |
| 5,946,266 | 8/1999 | Iwamoto et al. ......................... | 365/233 |

FOREIGN PATENT DOCUMENTS 8-212773  8/1996  Japan .

*Primary Examiner*—David Nelms
*Assistant Examiner*—Hien Nguyen
*Attorney, Agent, or Firm*—McDermott, Will & Emery

[57] ABSTRACT

Pre-amplifier circuits latch circuits, and output circuits respectively corresponding to a plurality of memory arrays are provided, and a data bus is provided common to these output circuits. The data bus provided extending in the column-direction over a memory array. Thus, a synchronous semiconductor memory device adapted for merging a logic and allowing the data bus width to be readily expanded without increasing the area occupied by interconnections and without conflicts of interconnections can be provided.

17 Claims, 16 Drawing Sheets

SYNCHRONOUS SEMICONDUCTOR MEMORY DEVICE SUITABLE FOR MERGING WITH LOGIC

BACKGROUND OF THE INVENTION

1. Field of the Invention

The present invention relates generally to synchronous semiconductor memory devices operating in synchronization with a clock signal, and more particularly to a logic-merged synchronous semiconductor memory device integrated with a processor or a logic circuit on the same semiconductor chip. More specifically, the present invention relates to the configuration of a data input/output circuit for a logic-merged synchronous semiconductor memory device.

2. Description of the Background Art

FIG. 20 is a schematic diagram of the general configuration of a conventional clock synchronous semiconductor memory device. In FIG. 20, the conventional clock synchronous semiconductor memory device includes memory arrays 1a to 1d each having a plurality of memory cells arranged in a matrix of rows and columns, pre-amplifier circuits 2a to 2d provided corresponding to memory arrays 1a to 1d to amplify and latch data in a selected memory cell in a corresponding memory array, a latch circuit 3 coupled in common to pre-amplifier circuits 2a to 2d through an internal read data bus RDF to latch data transferred from pre-amplifier circuits 2a to 2d, and an output circuit 4 coupled to latch circuit 3 through a data bus RD to buffer data transferred from latch circuit 3 for external output. Pre-amplifier circuits 2a to 2d each include pre-amplifiers to amplify 16-bit selected memory cell data received from corresponding memory arrays 1a to 1d through global data lines GIO0 to GIO3 and latches to latch the data amplified by the pre-amplifiers. The latches included in pre-amplifier circuits 2a to 2d (first stage latches) respectively transmit data latched according to transfer instruction signals OES0 to OES3 from a control circuit 5 onto internal read data bus RDF.

Output circuit 4 includes a latch coupled to latch circuit 3 through 16-bit internal data bus RD for latching 16-bit data from latch circuit 3, and an output buffer to buffer data held by the latch for external output. The latch in output circuit 4 latches and outputs 16-bit data transferred from latch circuit 3 according to a transfer instruction signal CLKOE from control circuit 5. Control circuit 5 generates instruction signals OES0 to OES3 and signal CLKOE in synchronization with an internal dock signal CLK, when data is read out.

Memory arrays 1a to 1d constitute banks #0 to #3, respectively, and control circuit 5 activates/inactivates these banks #0 to #3 independently from each other. Herein, the "activation" of a bank refers to the state where a word line is held in a selected state, and memory cell data connected to the selected word line is latched by a sense amplifier. The operations of the clock synchronous semiconductor memory device shown in FIG. 20 will be now described referring to a timing chart in FIG. 21.

In a clock cycle #a, a read command to instruct a data reading operation is applied. Herein, the command is applied as a combination of the states of a plurality of control signals. Control circuit 5 incorporates the read command at a rising edge of internal clock signal CLK and identifies the instruction of data reading. An address signal ADD(A) to address a memory cell to access and a bank address BA specifying a bank to be accessed are applied simultaneously with the application of the read command. Control circuit 5 starts a memory column selecting and data reading operation to bank (#0) addressed according to bank address BA and address signal ADD(A).

When bank #0 is selected, 16-bit memory cells are selected in a memory array 1a, and data in the 16-bit memory cells is transferred to a pre-amplifier circuit 2a through global data bus GIO0. The data latched by pre-amplifier circuit 2a is transferred to internal read data bus RDF according to transfer instruction signal OES0 and latched in latch circuit 3. Subsequently, latch circuit 3 transfers the latched data, according to a control signal RDGATE from control circuit 5, to output circuit 4 through internal data bus RD.

Output circuit 4 latches and outputs the data applied from latch circuit 3 according to an output control signal CLKOE. Instruction signals OES0, RDGATE and CLKOE are activated in synchronization with internal clock signal CLK. A certain clock cycle(s) is necessary for transferring data from pre-amplifier circuit 2a to output circuit 4. Therefore, first data a0 from output circuit 4 is output in clock cycle #c, and first data a0 is defined and sampled by an external device at a rising edge of clock signal CLK in clock cycle #d. The number of clock cycles required since the application of the read command until valid data is output is called CAS latency.

Control circuit 5 sequentially generates address signals with the first address ADD(A) being a head address and controls a column selecting operation to be executed in a selected bank in each clock cycle. The number of pieces of data which can be sequentially read out when a single read command is applied is called burst length. In FIG. 21, a data reading operation when the burst length is 4 is shown. Data a1, a2, and a3 are sequentially read out in synchronization with clock signal CLK in clock cycles #d, #e, and #f respectively.

In reading data from bank #0 (memory array 1a), a read command is once again applied in clock cycle #e to specify another bank. In FIG. 21, bank address BA specifies bank #1 by way of illustration. By the read command to bank #1, control circuit 5 executes a memory cell column selecting operation in memory array 1b, and sequentially reads out data through pre-amplifier circuit 2b. In bank #1, the CAS latency in the data reading operation is also 3. Therefore, after the final data a3 is transferred from memory array 1a (bank #0) to output circuit 4, the first data b0 is transferred from bank #1 through pre-amplifier circuit 2b to latch circuit 3 and latched therein, and output through output circuit 4 in clock cycle #g. In clock cycles #h and #i, data b0 and b1 read out from bank #1 are sequentially defined.

As described above, memory arrays 1a to 1d are formed in the bank-configuration and activated independently from each other and one bank is accessed while another bank is accessed to read memory cell data, data may be serially read out, which permits high-speed accessing operations.

Furthermore, by applying an active command ACT to one bank and selecting a word line while accessing another bank, time required for page switching may be hidden by the data accessing time, and data may be serially read out without otherwise generated penalty in page accessing.

Note that a power supply circuit 6a is provided between memory arrays 1a and 1c, and a power supply circuit 6b is provided between memory arrays 1b and 1d. These power supply circuits 6a and 6b generate power supply Vcc, ground voltage GND, high voltage Vpp for driving a word line, substrate bias voltage Vbb, and the like. By providing one power supply circuit for each bank, the load of the power supply circuit is alleviated as compared to the case of driving all the memory arrays by one power supply circuit, so that necessary voltage may be stably supplied and stable operations may be secured. In particular, 16-bit pre-amplifiers and latches and output buffers operate in reading 16-bit data, relatively large current consumption results, and the required large current may be sufficiently secured and the data may be stably read out as a result.

FIG. 22 is a diagram specifically showing the configuration of a data reading portion in the clock synchronous semiconductor memory device shown in FIG. 20. FIG. 22 shows the configuration of a 1-bit data reading portion. In FIG. 22, pre-amplifier circuits 2a to 2d for banks #0 to #3 are coupled in common to internal read data bus lines RDFL and /RDFL. Pre-amplifier circuit 2a includes a pre-amplifier 2aa to amplify data in a selected memory cell, an inverter latch 2ab to latch the data amplified by pre-amplifier 2aa, and a transfer circuit 2ac to transfer the data latched by inverter latch 2ab to read data bus lines RDFL and /RDFL in response to transfer instruction signal OES0. Transfer circuit 2ac includes a tri-state buffer activated in response to transfer instruction signal OES0.

Pre-amplifier circuit 2b includes a pre-amplifier 2ba to amplify data in a selected memory cell in bank #1, an inverter latch 2bb to latch the data amplified by pre-amplifier 2ba, and a transfer circuit 2bc to transfer the data latched by inverter latch 2bb to internal read data bus lines RDFL and /RDFL in response to activation of transfer instruction signal OES1.

Pre-amplifier circuit 2c includes a pre-amplifier 2ca to amplify applied memory cell data, an inverter latch 2cb to latch the data amplified by pre-amplifier 2ca, and a transfer circuit 2cc to transfer the data latched by inverter latch 2cb to internal read data bus lines RDFL and /RDFL in response to activation of transfer instruction signal OES2.

Pre-amplifier circuit 2d includes a pre-amplifier 2da to amplify data in a selected memory cell in bank #3, an inverter latch 2db to latch the data amplified by pre-amplifier 2da, and a transfer circuit 2dc to transfer the data latched by inverter latch 2db to internal read data bus lines RDFL and /RDFL in response to activation of transfer instruction signal OES3. Transfer circuits 2bc to 2dc are each implemented by a tri-state buffer which in turn amplifies and outputs applied data when activated and enters a high impedance state when inactivated.

Pre-amplifiers 2aa and 2da are activated in response to activation of pre-amplifier activation signals PAE0 to PAE3, respectively. Pre-amplifier activation signals PAE0 to PAE3 and transfer instruction signals OES0 to OES3 are each activated when a corresponding bank is a selected bank.

Latch circuit 3 includes a transfer gate 3a responsive to activation of transfer instruction signals RDGATE and /RDGATE for transferring data on internal data bus lines RDFL and /RDFL, and an inverter latch 3b which latches data transferred from transfer gate 3a. Transfer gate 3a includes a CMOS transmission gate provided to each of internal read data bus lines RDFL and /RDFL.

Output circuit 4 includes a transfer gate 4a to transfer a signal on the latch nodes RDL and /RDL of inverter latch 3b according to transfer instruction signals CLKOE and /CLKOE, an inverter latch 4b to latch the data on nodes RDL and /RDL transferred from transfer gate 4a, and a main amplifier 4c to amplify and externally output the data latched by inverter latch 4b through the output node. Transfer gate 4a includes a CMOS transmission gate provided for each of latch nodes RDL and /RDL. The operations of the reading portion of the clock synchronous semiconductor memory device shown in FIG. 22 will be now described referring to a timing chart in FIG. 23. Note that FIG. 23 show a data reading operation where the burst length is 1 and the CAS latency is 3.

A read command is applied in clock cycle #a, and simultaneously applied bank address BA specifies bank #0. In bank #0, a column selecting operation is performed according to address signal ADD(A), selected memory cell data is transferred to pre-amplifier 2aa, then pre-amplifier activation signal PAE0 is activated, and pre-amplifier 2aa amplifies the memory cell data. Inverter latch 2ab latches the data amplified by pre-amplifier 2aa.

A read command is again applied in clock cycle #b, and simultaneously applied bank address BA specifies bank #1. In bank #1 a column selecting operation is performed according to simultaneously applied address signal ADD(B), and selected memory cell data is transferred to pre-amplifier 2ba. Pre-amplifier activation signal PAE1 is then activated, pre-amplifier 2ba amplifies the memory cell data and inverter latch 2bb latches the data amplified by pre-amplifier 2ba.

In this clock cycle #b, a transfer instruction signal OES0 is activated in synchronization with a rising of clock signal CLK, and in bank #0, transfer circuit 2ac is activated to transfer data Q0 latched by inverter latch 2ab to internal read data bus lines RDFL and /RDFL.

In this clock cycle #b, data transfer instruction signal RDGATE is activated in synchronization with a rising of clock signal CLK, which turns on transfer gate 3a, and data Q0 transferred onto internal read data bus lines RDFL and /RDFL is transferred to inverter latch 3b. Inverter latch 3b latches data Q0 applied through transfer gate 3a.

In clock cycle #c, transfer instruction signal OES1 is activated in synchronization with a rising of clock signal CLK, and transfer circuit 2bc for bank #1 is activated to transfer data latched by inverter latch 2bb in clock cycle #b to internal read data bus lines RDFL and /RDFL. In this clock cycle #c, transfer instruction signal CLKOE attains an H level in synchronization with a rising of clock signal CLK, which turns on transfer gate 4a, and main amplifier 4c amplifies the data applied through transfer gate 4a for external output. Before transfer instruction signal CLKOE falls to an L level, transfer instruction signal RDGATE is activated in response to a rising of clock signal CLK, and memory cell data Q1 transmitted onto internal read data bus lines RDFL and /RDFL is transferred, and inverter latch 3b latches data Q1 applied through transfer gate 3a. A certain time period is necessary for the data transfer, during which period transfer instruction signal CLKOE attains an L level before the data in inverter latch 3b is defined, and the unstable data (Q1) is prevented from being output.

In clock cycle #d, transfer instruction signal CLKOE is again activated in synchronization with a rising of clock signal CLK, which turns on a transfer gate 4a, and the data latched by inverter latch 3b is externally transmitted through main amplifier 4c. Data Q0 and Q1 are defined at a rising of clock signal CLK in clock cycles #d and #e, respectively and sampled by an external processor or the like.

As shown in FIG. 23, the transfer instruction signal is consecutively activated in synchronization with clock signal CLK and data is transferred from the pre-amplifier circuit through the internal data read bus, and transfer circuit 3 to output circuit 4 in a pipeline manner, and therefore while a long period of time is necessary for the data to be transferred from one bank to an outside of the device (3 clock cycles in FIG. 23), the data can be serially read out once the data starts to be read out, so that high-speed data reading is achieved.

Note that although the burst length in the data reading in FIG. 23 is 1, the burst length may be 4, 8 or the like.

As shown in FIG. 24, let us now assume that a clock synchronous semiconductor memory device (SDRAM: Synchronous Random Access Memory) 102 and a processor or application specific logic circuit (hereinafter collectively referred to as "logic") 104 are integrated on a semiconductor chip 100. Clock synchronous semiconductor memory device (SDRAM) 102 and logic 104 are coupled through an internal data bus 106. As clock synchronous semiconductor memory device (SDRAM) 102, the clock synchronous semiconductor memory device shown in FIG. 20 is applied. In this case, output circuit 4 in FIG. 20 is coupled to data bus 106. Output circuit 4 in FIG. 20 outputs 16-bit data. In order to increase the bandwidth in data transfer between clock synchronous semiconductor memory device 102 and logic 104, the bus width of internal data bus 106 is for example expanded to 256 bits to 1024 bits. Since clock synchronous semiconductor memory device (SDRAM) 102 and logic 104 are integrated on semiconductor chip 100, the lead pitch condition for pin terminals may be placed out of consideration, and therefore internal data bus 106 may be provided along the pitch of the internal interconnections, which expands the bus width. In this case, however, applying the configuration of the clock synchronous semiconductor memory device shown in FIG. 20 as it is gives rise to the following problem.

Let us now assume that output circuit 4 outputs 256-bit data as shown in FIG. 25. More specifically, internal data bus 106 shown in FIG. 24 has a bus width of 256 bits. In this case, data bus RD between output circuit 4 and latch circuit 3 has a bus width of 256 bits. Two-bank configuration where memory arrays 1a and 1b constitute bank #0 and memory arrays 1c and 1d constitute bank #1 is now considered. In this case, global data buses GIO0 to GIO3 respectively in memory arrays 1a to 1d each have a bus width of 128 bits. Meanwhile, internal read data bus RDF coupled in common to pre-amplifier circuits 2a to 2d has a bus width of 256 bits. Global data buses GIO0 to GIO3 at uppermost interconnections in the arrays can have their bus widths expanded relatively easily. However, if the bus widths of internal read data bus RDF and bus RD are expanded to 256 bits, these internal data bus RDF and data bus RD must be provided among the memory arrays, which increases the area occupied by the buses and the area of the chip accordingly. If the bus width of internal data bus 106 shown in FIG. 24 is expanded to 1024, for example, the bus widths of internal read data bus RDF and data bus RD increase and the area of the chip increases as well.

In particular, if the read data bus to transmit reading data and the write data bus to transmit writing data are separately provided, the area occupied by buses is further increased, which increases the area of the chip.

SUMMARY OF THE INVENTION

It is one object of the present invention to provide a clock synchronous semiconductor memory device which permits the bus width to be readily expanded without increasing the area occupied by the bus in the chip.

Another object of the present invention is to provide a clock synchronous semiconductor memory device having a circuit configuration suitable for merging with a logic.

A synchronous semiconductor memory device according to the present invention includes a plurality of memory arrays arranged in a matrix of rows and columns and each having a plurality of memory cells arranged in a matrix of rows and columns, and a plurality of pre-amplifier circuits provided corresponding to the memory arrays for amplifying data read out from a selected memory cell in a corresponding memory array, a plurality of read transfer circuits provided corresponding to the plurality of pre-amplifier circuits for transferring data amplified by a corresponding pre-amplifier circuit in synchronization with a clock signal, and a data bus provided in common to the plurality of memory arrays. The data bus includes a plurality of sub data buses each provided in common to memory arrays aligned along rows or columns of the plurality of memory arrays and extending along one direction over at least one of corresponding memory arrays.

The synchronous semiconductor memory device according to the present invention further includes a plurality of output circuits provided for each of the plurality of read transfer circuits to transmit data received from a corresponding read transfer circuit to the data bus.

By providing an output circuit corresponding to each memory array and providing a data bus extending over the memory array to be coupled to the output circuit, the interconnection region of the data bus may be effectively eliminated, and the data bus width may be expanded without increasing the area occupied by the interconnections. Since an output circuit is provided corresponding to each memory array, a data transfer path between the memory array and a corresponding output circuit, and a data bus may be provided in separate interconnection layers, so that the internal data transfer bus and the data bus for data transfer with the logic may be provided overlapping in a plan view, which permits the bus width to be readily expanded without increasing the area occupied by the interconnections.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
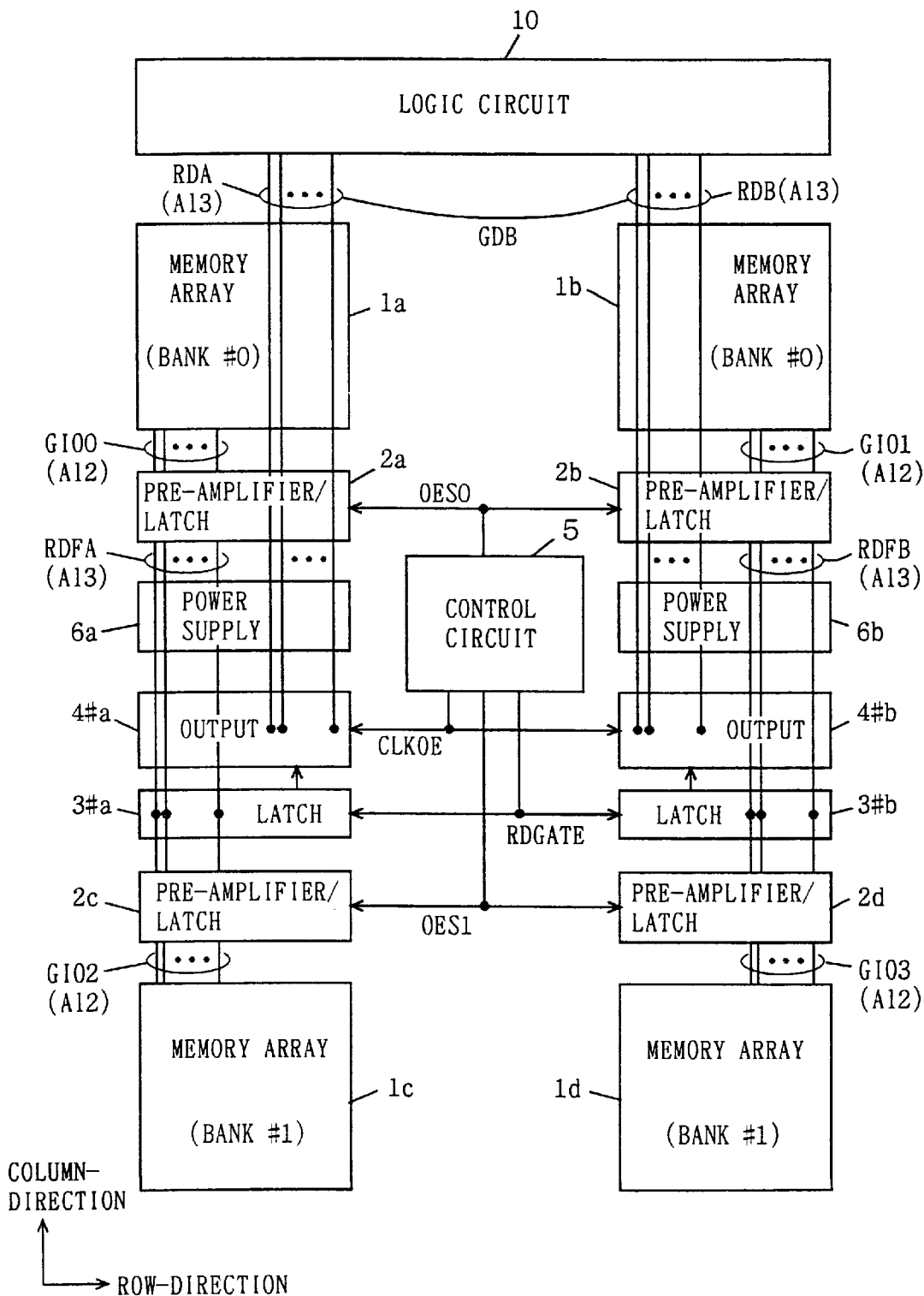
FIG. 1 is a schematic diagram showing the general configuration of a synchronous semiconductor memory device according to a first embodiment of the present invention.

FIG. 1 is a schematic diagram showing the general configuration of a clock synchronous semiconductor memory device according to a first embodiment of the present invention. The clock synchronous semiconductor memory device shown in FIG. 1 is a logic-merged synchronous semiconductor memory device integrated on the same semiconductor chip together with a logic circuit 10.

In FIG. 1, the synchronous semiconductor memory device includes 4 separately provided memory arrays 1a to 1d. Memory arrays 1a to 1d, although not clearly illustrated, each have a plurality of dynamic type memory cells arranged in a matrix of rows and columns. Memory arrays 1a and 1b aligned in the row-direction constitute a bank #0, while memory arrays 1c and 1d aligned in the row-direction constitute a bank #1. In this bank arrangement, row selecting circuits and column selecting circuits are provided corresponding to memory arrays 1a to 1d, but these circuits are not clearly shown in FIG. 1. In the arrangement of memory arrays 1a to 1d shown in FIG. 1, memory arrays aligned in the row-direction constitute the same bank, and memory arrays aligned in the column-direction (memory arrays 1a and 1c, for example) constitute different banks.

Figure 22:
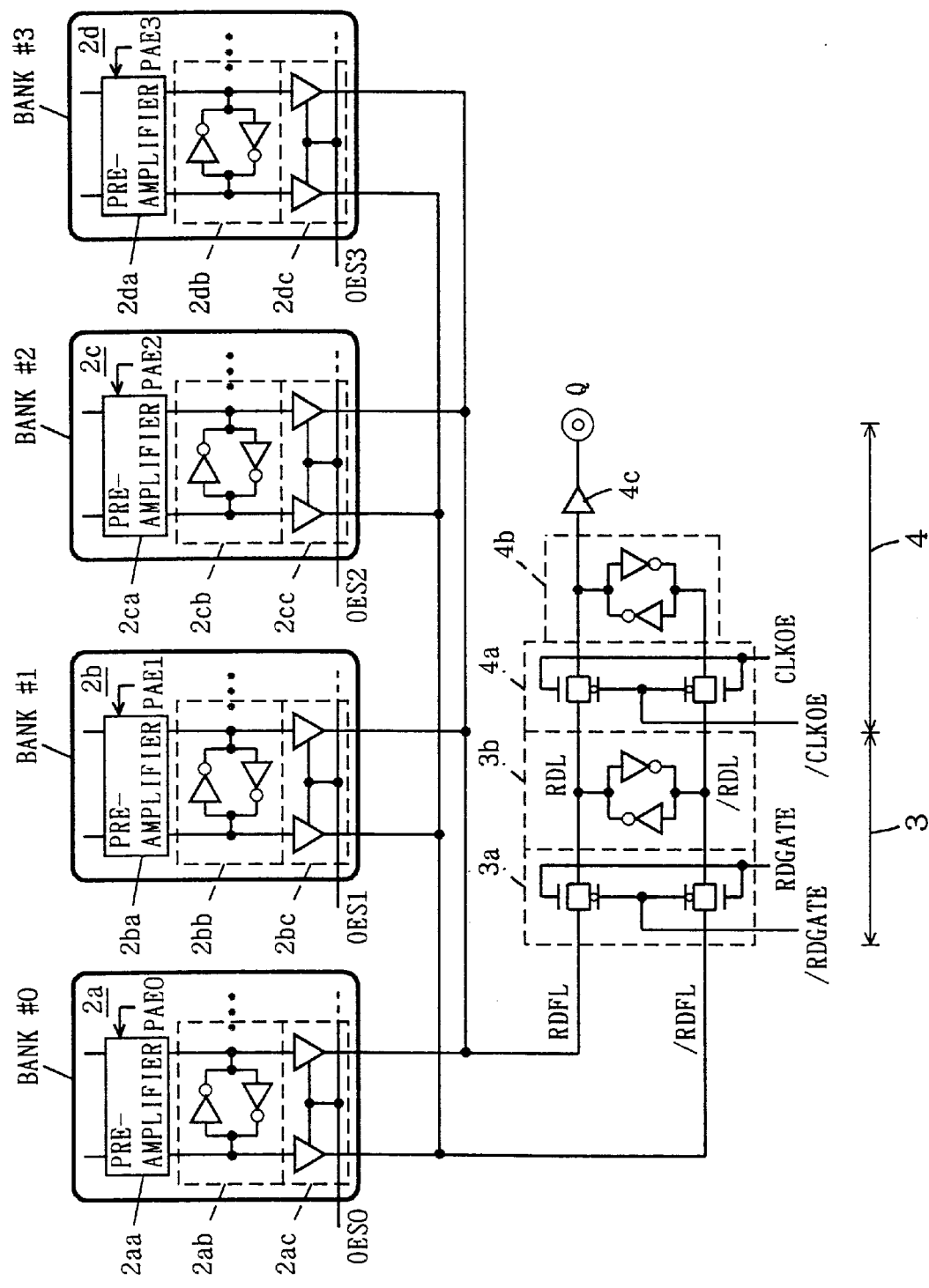
FIG. 22 is a schematic diagram showing the configuration of a reading portion of 1-bit data in the synchronous semiconductor memory device shown in FIG. 20.
Figure 23:
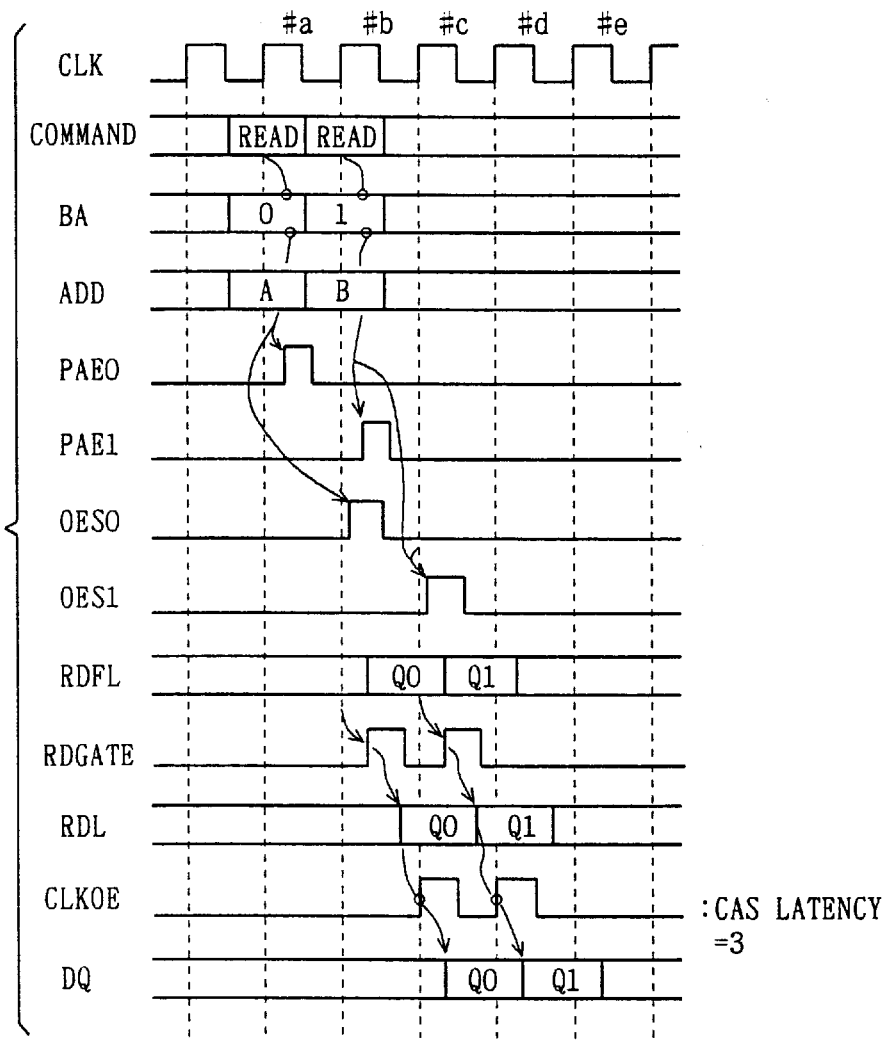
FIG. 23 is a timing chart representing the operation of the circuit shown in FIG. 22.
Figure 24:
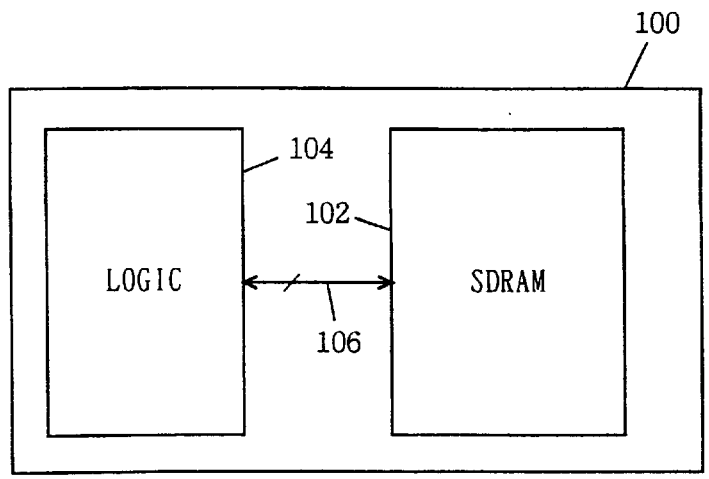
FIG. 24 is a schematic diagram showing the configuration of a conventional logic-merged synchronous semiconductor memory device.
Figure 25:
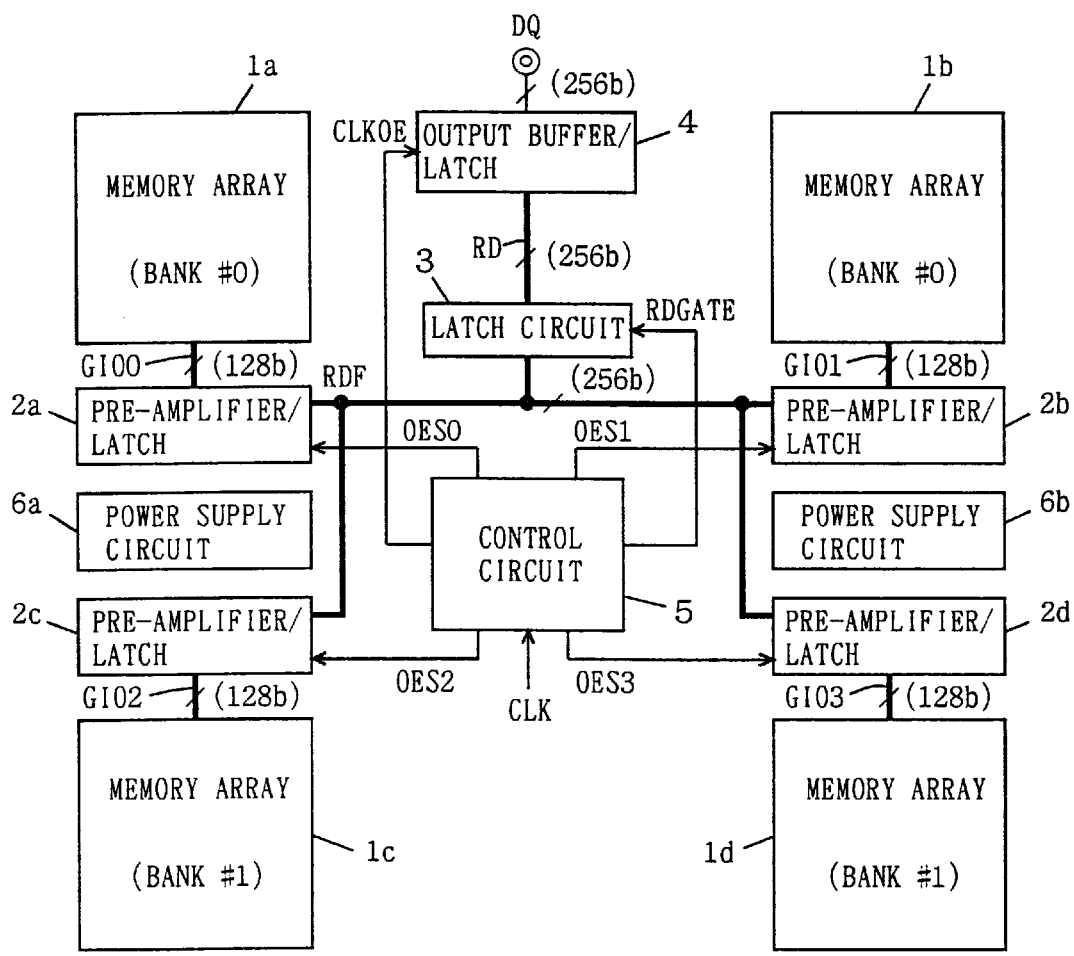
FIG. 25 is a schematic diagram showing the bus configuration where the bus width of the synchronous semiconductor memory device shown in FIG. 20 is expanded.

Pre-amplifier circuits 2a to 2d are provided corresponding to memory arrays 1a to 1d, respectively. These pre-amplifier circuits 2a to 2d each include a pre-amplifier to amplify memory cell data read out from a corresponding memory array through global data buses GIO0 to GIO3, a latch circuit to latch data output from the pre-amplifier, and a transfer circuit to transfer the latched data. This is the same as the configuration shown in FIG. 22.

A latch circuit and an output circuit are provided common to different banks. More specifically, a latch circuit #3a to latch data transferred from pre-amplifier circuits 2a and 2c is provided between memory arrays 1a and 1c, and a latch circuit 3#b to latch data transferred from pre-amplifier circuits 2b and 2d is provided between memory arrays 1b and 1d. Output circuits 4#a and 4#b are provided adjacent to these latch circuits 3#a and 3#b. These output circuits 4#a and 4#b receive data from latch circuits #3a and #3b for external output. Latch circuits 3#a and #3b have the same configuration as that of latch circuit 3 shown in FIG. 22 and output circuits 4#a and 4#b have the same configuration as that of output circuit 4 shown in FIG. 22.

A sub data bus RDA is provided extending in the column-direction over memory array 1a and pre-amplifier circuit 2a, while a sub data bus RDB is provided extending in the column-direction over memory array 1b and pre-amplifier circuit 2b. Sub data buses RDA and RDB constitute a data bus GDB. Therefore, data bus GDB is provided common to memory arrays 1a to 1d. Sub data bus RDA is coupled to output circuit 4#a and logic circuit 10, while sub data bus RDB is coupled to output circuit 4#b and logic circuit 10.

A power supply circuit 6a is provided between pre-amplifier circuit 2a and output circuit 4#a, and a power supply circuit 6b is provided between pre-amplifier circuit 2b and output circuit 4#b, so that necessary voltages Vcc, GND, Vpp and Vbb are stably supplied.

A control circuit 5 is provided in the central part to control the operations of pre-amplifier circuits 2a and 2b, the latch/transfer operations of latch circuits 3#a and 3#b, the data transfer operations of output circuits 4#a and 4#b according to the previously described signals OES0, OES1, RDGATE and CLKOE, respectively.

Sub data buses RDA and RDB both cover a width of 128 bits, and therefore data bus GDB has a width of 256 bits. Internal read data bus RDFA connected between latch circuit 3#a and pre-amplifier circuits 2a and 2c has a width of 128 bits, and internal read data bus RDFB coupling pre-amplifier circuit 2b and 2d to latch circuit 3#b has a width of 128 bits.

Pre-amplifier circuits 2a to 2d are coupled to corresponding memory arrays 1a to 1d respectively through global data buses GIO0 to GIO3. These global data buses GIO0 to GIO3 each have a width of 128 bits. Therefore, memory cells of 128 bits are selected simultaneously in a single memory array, 2 memory arrays are selected simultaneously when a single bank is specified, and therefore 256 bit-data in total can be transferred as a unit.

Sub data buses RDA and RDB are provided extending in the column-direction over memory arrays 1a and 1b. Therefore, even if the bus widths of these sub data buses RDA and RDB are wide, the area occupied by the sub data buses may be effectively "hidden", so that the occupied area on the chip may be prevented from increasing.

Sub data buses RDA and RDB are formed for example by a third level aluminum interconnection lines (Al3). Global data buses GIO0 to GIO3 are for example formed by a second level aluminum interconnection layer (Al2). Internal read data bus RDFA coupling pre-amplifier circuits 2a and 2b to latch circuit 3#a is preferably provided extending along the column-direction over power supply circuit 6a and output circuit 4#a and therefore preferably formed by the third level aluminum interconnection layer (Al3). This is because the power supply line, ground line, high voltage transmission line, negative voltage transmission line and the like are normally formed by the third level aluminum interconnection lines. (The third level aluminum interconnection layer having an excellent electrical characteristic may stably transmit a desired voltage with low resistance.)

If internal read data bus RDFA is formed by the third level aluminum interconnection layer and the pitch of the voltage transmission line of power supply circuit 6a is large enough, 128-bit internal read data bus RDFA may be provided at an appropriate interval. Internal read data bus RDFB coupling pre-amplifier circuits 2b and 2d to latch circuit 3#b is preferably formed by the third level aluminum interconnection layer (Al3). This internal read data bus RDFB is also provided extending in the column-direction over power supply circuit 6b and output circuit 4#b. Power supply circuit 6b normally includes a power supply line, a ground line, a high voltage transmission line and a negative voltage transmission line. However, if more than enough pitch is secured for these voltage transmission lines in power supply circuit 6b, internal read data bus RFB may be provided well at a desired pitch. Output circuits 4#a and 4#b and latch circuits 3#a and 3#b communicate data with each other and are connected by the second or first level aluminum interconnection lines.

In the configuration of the clock synchronous semiconductor memory device shown in FIG. 1, memory arrays 1a and 1b constitute bank #0, while memory arrays 1c and 1d constitute bank #1. In a data reading operation such as an accessing operation to bank #0, memory arrays 1a and 1b are selected, and 128-bit memory cell data is transmitted to pre-amplifier circuits 2a and 2b through global data buses GIO0 and GIO1, respectively. Subsequently, under the control of control circuit 5, transfer instruction signal OES0 is activated, data latched in pre-amplifier circuits 2a and 2b is transmitted onto internal read data buses RDFA and RDFB, and then to latch circuits 3#a and 3#b. Then, under the control of control circuit 5, latch circuits 3#a and 3#b operate simultaneously to transfer data to corresponding output circuits 4#a and 4#b. Then, again under the control of control circuit 5, output circuits 4#a and 4#b operate according to transfer control signal CLKOE and transfer 128-bit data onto sub read data buses RDA and RDB.

In the configuration shown in FIG. 1, when the width of the data bus is expanded up to 256 bits, the area occupied by interconnection lines may be prevented from increasing by providing sub data buses to extend over memory arrays 1a and 1b. Pre-amplifier circuits 2a and 2b are coupled together to latch circuit 3#a through internal read data bus RDFA, while pre-amplifier circuits 2b and 2d are coupled together to latch circuit 3#b through internal read data bus RDFB. Internal read data buses RDFA and RDFB are provided extending over power supply circuits 6a and 6b and output circuits 4#a and 4#b, and if the bus widths of these read data buses RDFA and RDFB are wide, the area occupied by the interconnection lines may be restrained from increasing.

If the bus width is wide, the number of pre-amplifiers simultaneously operating in pre-amplifier circuits 2a to 2d increases, and the numbers of latch circuits and transfer circuits increase as well. Output circuits 4#a and 4#b each have output buffers (main amplifiers) of 128-bit, and consume relatively large current when data is output. However, by providing power supply circuits 6a and 6b in the vicinity, current may be sufficiently supplied even if these large number of circuits operate at a time, so that data may be stably transferred.

As shown in FIG. 1, by providing data buses in common to memory arrays 1a to 1d, in other words in common to banks #0 and #1, and by providing these data buses in layers located above memory arrays or other circuit elements, the bus width may be widened without increasing the area occupied by the interconnection lines, so that the band width of data transfer may be expanded to be large enough.

Note that logic circuit 10 may be any of a processor and a logic circuit performing dedicated processings, and has only to exchange data with the clock synchronous semiconductor memory device and to process the data.

Output circuits 4#a and 4#b may be provided between banks #0 and #1 to equalize time required for reading out data at the time of selecting bank #0 and #1, and the reading accessing time may be prevented from varying depending upon a selected bank. Output circuits 4#a and 4#b may be provided aligned with memory arrays 1a to 1d in the column-direction, so that if the number of output buffers increases as the number of output data bits of output circuits 4#a and 4#b increase, the chip area increases only for the widths of output circuits 4#a and 4#b in the column-direction, and the chip area can be restrained from increasing. By providing these output circuits 4#a and 4#b in alignment, data buses RDFA, RDFB, RDA, and RDB can be provided linearly extending in the column-direction, which makes the interconnection layout easier.

As described above, according to the first embodiment of the present invention, since data buses are provided extending over memory arrays, the area occupied by the interconnection lines can be restrained, the data bus width can be readily expanded, and the band width of data can be readily expanded, so that data can be transferred to the logic circuit at higher speed (since the number of data bits transferred in a single transfer cycle increases, the number of pieces of data transferred per unit time can be significantly increased.)

Second Embodiment

Figure 2:
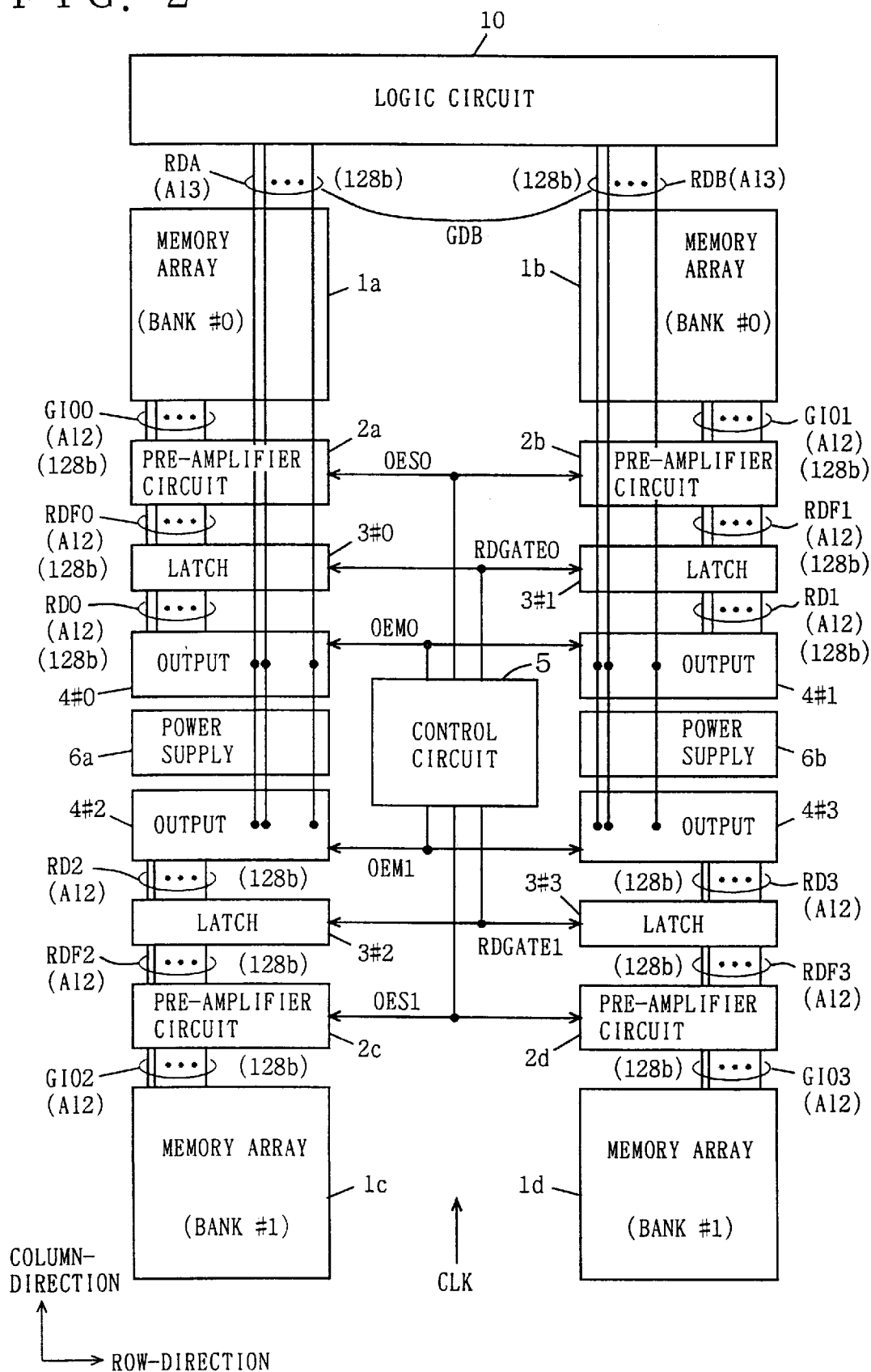
FIG. 2 is a schematic diagram showing the general configuration of a synchronous semiconductor memory device according to a second embodiment of the present invention.

FIG. 2 is a schematic diagram showing the general configuration of a synchronous semiconductor memory device according to a second embodiment of the present invention. In the configuration shown in FIG. 2, logic circuit 10 and the synchronous semiconductor memory device are integrated on the same semiconductor chip.

In FIG. 2, the synchronous semiconductor memory device includes 4 memory arrays 1a to 1d similarly to the synchronous semiconductor memory device shown in FIG. 1. These memory arrays 1a to 1d have dynamic type memory cells arranged in a matrix of rows and columns. Memory arrays 1a and 1b constitute a bank #0, while memory arrays 1c and 1d constitute a bank #1.

For memory array 1a, there are provided a pre-amplifier circuit 2a coupled to memory array 1a through global data bus GIO0 to amplify data applied through global data bus GIO0 and transfer the amplified data according to transfer instruction signal OES0 from a control circuit 5, a latch circuit 3#0 which latches and transfers 128-bit data from pre-amplifier circuit 2a according to transfer instruction signal RDGATE0 from control circuit 5, and an output circuit 4#0 which takes in and outputs the 128-bit data from latch circuit 3#0 according to transfer control signal OEM0 from control circuit 5. Pre-amplifier circuit 2a and latch circuit 3#0 are coupled by a 128-bit read data bus RDF0 and latch circuit 3#0 is coupled to output circuit 4#0 by a 128-bit data bus RD0. Global data bus GIO0, a read data bus RDEF0 and a data bus RD0 are formed in the second level aluminum layer (Al2).

Similarly for memory array 1b, there are provided a pre-amplifier circuit 2b which amplifies memory cell data from memory array 1b received through global data bus GIO0 and transfers the amplified data according to transfer instruction signal OES0, a latch circuit 3#1 which latches data received from pre-amplifier circuit 2b through a 128-bit read data bus RDF1 according to transfer instruction signal RDGATE0 and an output circuit 4#1 which incorporates and outputs the data received from latch circuit 3#1 through a 128-bit read data bus RDF1 according to transfer control signal OEM0.

For memory array 1c, there are provided a pre-amplifier circuit 2c which amplifies memory cell data from memory array 1c received through a 128-bit global data bus GIO2 and transfers the amplified data according to transfer instruction signal OES1, a latch circuit 3#2 which receives data from pre-amplifier circuit 2c through a 128-bit read data bus RDF2, incorporates and latches data applied according to transfer instruction signal RDGATE1, and an output circuit 4#2 which receives data from latch circuit 3#2 through a 128-bit data bus RD2, and incorporates and outputs data applied according to transfer instruction signal OEM1.

For memory array 1d, there are provided a pre-amplifier circuit 2d which amplifies data received through a 128-bit global data bus GIO3 and transfer the amplified data according to transfer instruction signal OES1 from control circuit 5, a latch circuit 3#3 which incorporates and latches data applied through a 128-bit read data bus RDF3 from pre-amplifier circuit 2d, and an output circuit 4#3 which incorporates and outputs data applied though a 128-bit data bus RD3 from latch circuit 3#3 according to transfer instruction signal OEM1.

A sub data bus RDA having a width of 128 bits is provided in common to output circuits 4#0 and 4#2 aligned in the column-direction. A sub data bus RDB having a width of 128 bits is provided to output circuits 4#1 and 4#3 aligned in the column-direction. These sub data buses RDA and RDB are formed in the third level aluminum layer, and provided extending in the column-direction over memory arrays 1a and 1b and over latch circuits 3#0 and 3#1 and output circuits 4#0 and 4#1. A power supply circuit 6a is provided between output circuits 4#0 and 4#2, while a power supply circuit 6b is provided between output circuits 4#1 and 4#3.

Global data buses GIO0 to GIO3, internal read data buses RDF0 to RDF3, and data buses RD0 to RD3 are formed in the second level aluminum interconnection layer (Al2). Power supply circuits 6a and 6b transmit necessary voltage through the third level aluminum interconnection lines.

A pipeline stage including circuits from a pre-amplifier circuit to an output circuit is provided for each of memory arrays 1a to 1d. Thus, data buses in each pipeline stage may be formed by the second level aluminum interconnection layer such that the data buses can be prevented from butting against the power supply line in the third level aluminum interconnection layer from power supply circuits 6a and 6b. Sub data buses RDA and RDB are the third level aluminum interconnection layer, and therefore data buses in each pipeline stage and these sub data buses may be provided overlappingly in a plan view, so that the interconnections will not conflict with each other, and the width of each data bus can be readily expanded.

Output circuits 4#0 to 4#3 are each set in an output high impedance state when they are inactivated. Therefore, if sub data buses RDA and RDB are shared between different banks, data from a selected bank can be accurately transmitted to logic circuit 10 through these sub data buses RDA and RDB.

The number of output circuits 4#0 to 4#3 increases but the area occupied by output circuits 4#0 to 4#3 increases only in the column-direction. Sub data buses RDA and RDB and internal read data buses RDF0 to RDF3 can be formed in different interconnection layers, and these sub data buses RDA and RDB and internal read data buses RDF0 to RDF3 can be provided with enough margin, which restrains increase in the area occupied by the interconnection lines and makes the interconnection layout easier. In pre-amplifier circuits 2a to 2d and output circuits 4#0 to 4#3, 128-bit circuits operate in parallel. In such a case, since power supply circuits 6a and 6b may be reinforced such that a desired voltage may be supplied to these circuits, since there is enough margin in the third level aluminum interconnection layer.

Figure 3:
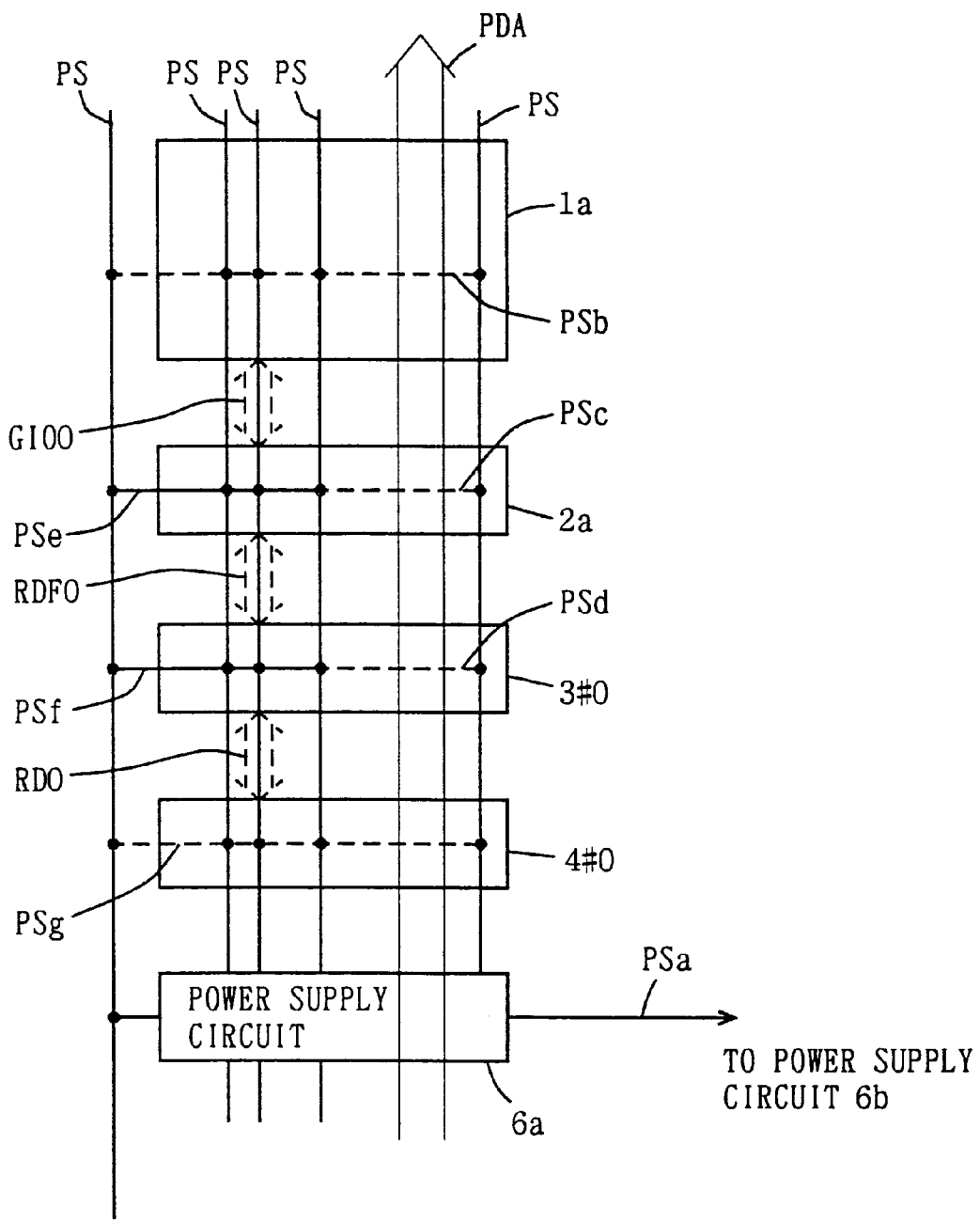
FIG. 3 is a diagram showing an example of a power supply arrangement in the synchronous semiconductor memory device shown in FIG. 2.

FIG. 3 is a schematic diagram showing the arrangement of the power supply lines from power supply circuit 6a to the pipeline stage in memory array 1a. In FIG. 3, power supply lines PS formed in the third level aluminum interconnection layer are provided parallel to sub data bus RDA in the column-direction from power supply circuit 6a. Power supply lines PS may transmit any of power supply voltage Vcc and ground voltage GND. Power supply lines PS are coupled together by the first level aluminum interconnection line PSb. This is for the purpose of preventing data bus RDA and sub power supply line PSb from colliding in memory array 1a when bus lines for global data bus GIO0 are provided in a distributed manner, and global data bus GIO0 is formed in the second level aluminum interconnection layer, while sub data bus RDA is formed in the third level aluminum interconnection layer, provided in a distributed manner over memory array 1a.

In pre-amplifier circuit 2a, power supply lines PS are coupled with each other by a power supply line PSe in the third level aluminum interconnection layer, and coupled with each other by a power supply line PSc in the second or first level aluminum interconnection layer. Sub power supply line PSc is formed in the first level aluminum interconnection layer when the interconnection lines of the peripheral circuits are provided in the second level aluminum interconnection layer, while if there is a space in the second level aluminum interconnection layer, sub power supply line PSc is formed in the second level aluminum interconnection layer.

In output circuit 4#0, power supply lines PS are coupled with each other by a sub power supply line PSg formed in the second level aluminum interconnection layer. Data bus RDA in the third level aluminum interconnection layer is provided extending over output circuit 4#0 further in the column-direction for the purpose of preventing sub data bus RDA provided in the third level aluminum interconnection layer and the sub power supply line from colliding.

Power supply circuit 6a is also coupled to power supply circuit 6b through a power supply line PSa. Data buses RDF0 and RD0 are formed in the second level aluminum interconnection layer. Therefore, power supply lines PS in the third level aluminum interconnection layer can be provided over data buses RDF0 and RD0 and global data bus GIO0. Thus, the resistance of the power supply lines can be equivalently reduced and the line widths can be equivalently widened so that the power supply voltage may be stably transmitted.

Therefore, as shown in FIG. 2, a pipeline stage from a pre-amplifier circuit to an output circuit may be provided for each of memory arrays 1a to 1d, a data transmission path for each pipeline stage may be formed by the second level aluminum interconnection layer, and a data bus coupled to a logic circuit may be formed by the third level aluminum interconnection layer, so that these data buses can be provided with enough margin while avoiding the collision of the interconnection lines. In addition, the power supply lines for the third aluminum interconnection layer from power supply circuit 6a can be provided with enough margin, and therefore the power supply lines may be reinforced.

Note that in the configuration shown in FIG. 3, when bus lines for sub data bus RDA are provided in a distributed manner, sub power supply lines PSe and PSf may be appropriately formed in the second or first level aluminum interconnection layer.

Figure 4:
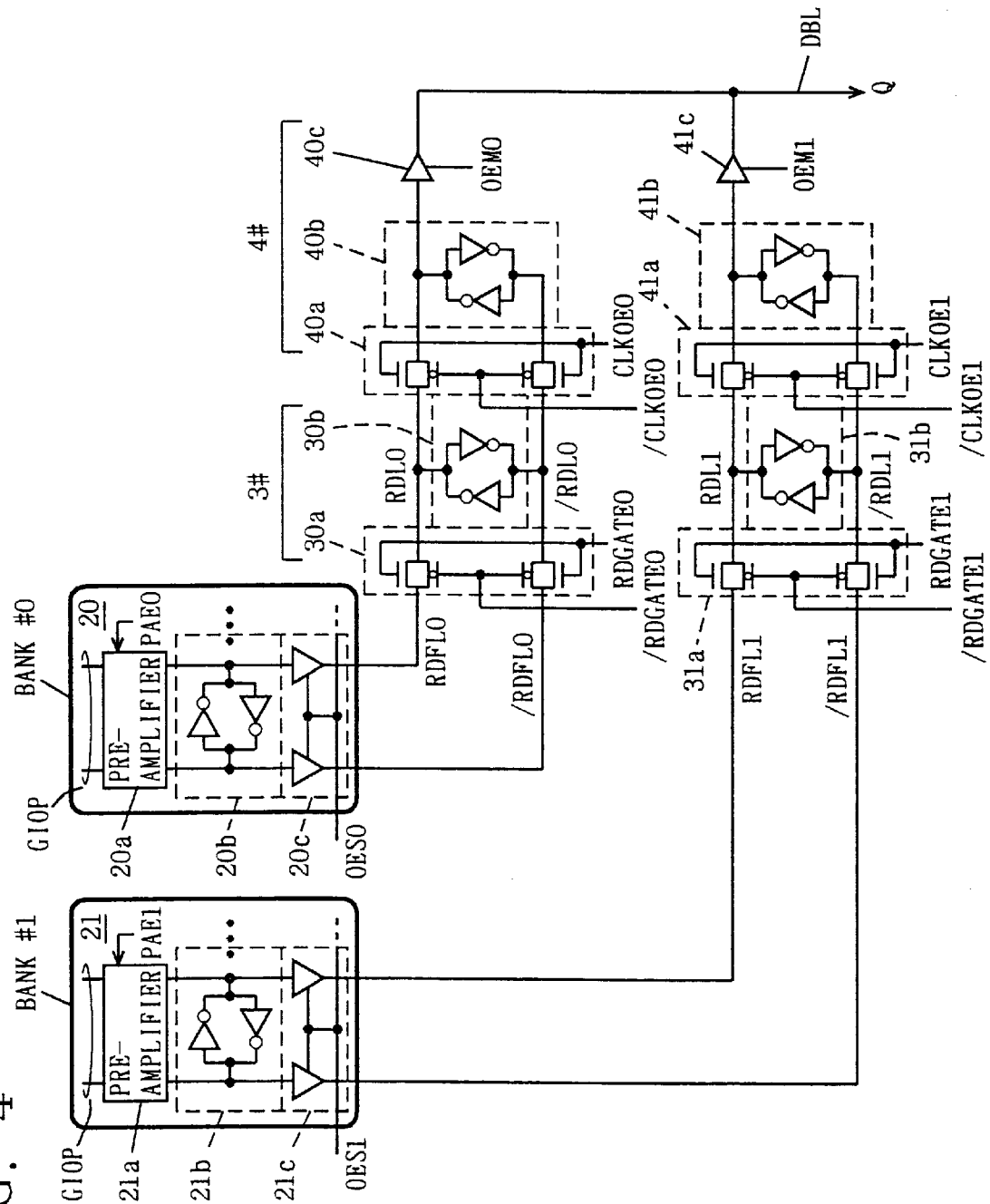
FIG. 4 is a diagram of a portion related to a reading operation of 1-bit data in the synchronous semiconductor memory device shown in FIG. 2.

FIG. 4 is a diagram showing the configuration of a data reading portion in the synchronous semiconductor memory device shown in FIG. 2. FIG. 4 shows a portion related to a 1-bit data reading operation in banks #0 and #1. Bank #0 may be any of memory arrays 1a and 1b, while bank #1 may be any of memory arrays 1c and 1d. However, since a sub data bus line DBL is shared between the banks, the memory arrays constituting these banks #0 and #1 are provided aligned in the column-direction in FIG. 2.

In bank #0, a pre-amplifier circuit 20 (2a: 2b) includes a pre-amplifier 20a activated in response to activation of a pre-amplifier activation signal PAE0 to amplify data applied through a global data bus line pair GIOP, an inverter latch 20b which latches the data amplified by pre-amplifier 20a, and a transfer circuit 20c which conducts in response to activation of transfer instruction signal OES0 to transmit complimentary data latched by inverter latch 20b to read data bus lines RDFL0 and /RDFL0. Transfer circuit 20c includes a tri-state buffer which attains a high impedance state when transfer instruction signal OES0 is in an inactive state.

Latch circuit 3# (3#0: 3#1) includes a transfer gate 30a which conducts in response to activation of transfer instruction signals RDGATE0 and /RDGATE0 and transfers a signal on read data bus lines RDFL0 and /RDFL0 to nodes RDL0 and /RDL0, and an inverter latch 30b which latches data applied through transfer gate 30a. Transfer gate 30a is formed by a CMOS transmission gate provided for each of bus lines RDFL0 and /RDFL0. Inverter latch 30b includes inverters connected in an antiparallel manner between nodes RDL0 and /RDL0.

Output circuit 4# (4#0: 4#1) includes a transfer gate 40a which conducts in response to activation of transfer instruction signal CLKOE0 and /CLKOE0 and transfers data latched by inverter latch 30b, an inverter latch 40b which latches data applied through transfer gate 40a, and a main amplifier 40c brought into an operating state to amplify and transmit the data latched by inverter latch 40b when output activation signal OEM0 is activated. Transfer gate 40a includes a CMOS transmission gate provided for each of nodes RDL0 and /RDL0. Main amplifier 40c is formed by a tri-state buffer which attains an output high impedance state when output activation signal OEM0 is in an inactive state.

In bank #1, a pre-amplifier circuit 21 (2C: 2d) includes a pre-amplifier 21a activated in response to activation of pre-amplifier activation signal PAE1 to amplify data applied through global data bus line pair GIOP, an inverter latch 21b which latches the data amplified by pre-amplifier 21a, and a transfer circuit 21c activated in response to activation of transfer instruction signal OES1 to amplify the data latched by inverter latch 21b and transmit the amplified data onto internal read data bus lines RDFL1 and /RDFL1. Transfer circuit 21c includes a tri-state buffer which attains an output high impedance state when transfer instruction signal OES1 is in an inactive state.

Latch circuit (3#2: 3#3) for bank #1 includes a transfer gate 31a activated in response to activations of transfer instruction signals RDGATE1 and /RDGATE1 to transfer a signal on internal read data bus lines RDFL1 and /RDFL1, and an inverter latch 31b which latches a signal applied through transfer gate 31a. Transfer gate 31a includes a CMOS transmission gate provided for each of bus lines RDFL1 and /RDFL1. Inverter latch 31b includes inverters connected with each other in an antiparallel manner between nodes RDL1 and /RDL1.

Output circuit (4#2; 4#3) includes a transfer gate 41a which conducts in response to activations of instruction signals CLKOE1 and /CLKOE1 and transfers data latched by inverter latch 31b, an inverter latch 41b which latches the data transferred through transfer gate 41a, and a main amplifier 41c which amplifies the data latched by inverter latch 41b and transfers the amplified data onto a data bus line DBL. Inverter latch 41b includes inverters connected in an antiparallel manner, and converts complimentary signals to a true signal. Main amplifiers 40c and 41c transfer reading data to logic circuit 10 through data bus line DBL transferring the true signal.

In data buses RDA and RDB (GDB), bus line RDL transfers a true signal, and a complimentary signal line pair is not used. Thus, the number of bus lines in data bus GDB can be reduced and the area occupied by the buses can be reduced.

Figure 5:
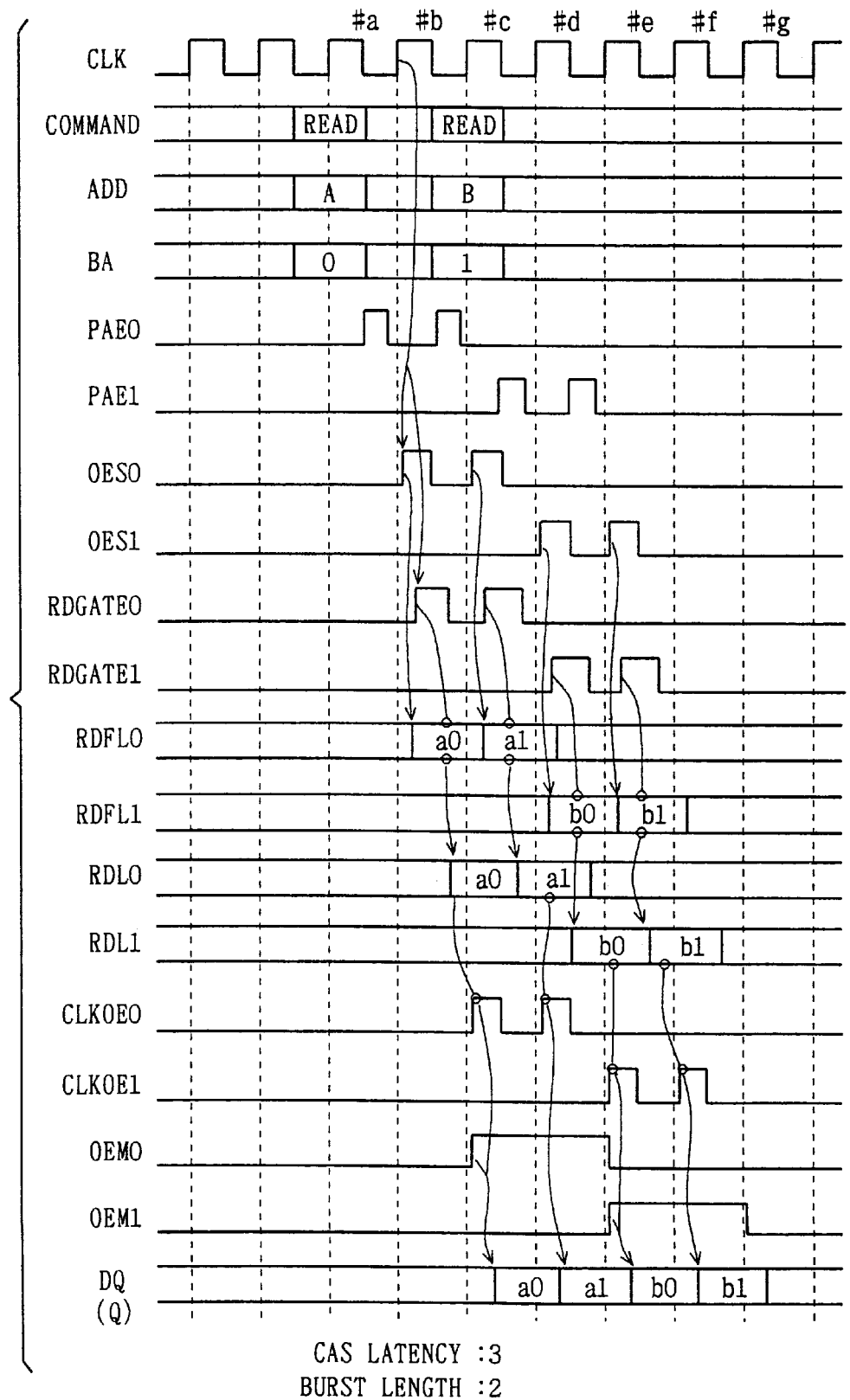
FIG. 5 is a timing chart representing the operations of the circuit shown in FIG. 4.

The operations of the data reading circuit shown in FIG. 4 will be now described referring to the timing chart in FIG. 5. FIG. 5 shows a data reading operation where the CAS latency is 3 and the burst length is 2 by way of illustration.

In clock cycle #a, a read command is applied, and a bank address BA specifies bank #0. In bank #0, a word line has been already driven to a selected state in a memory array by an active command, and data of memory cells connected to the selected word line has been latched by a sense amplifier (not shown). When the read command is applied, in bank #0, a column selecting operation is performed under the control of control circuit 5, pre-amplifier activation signal PAE0 is activated in synchronization with a rising of clock signal CLK, pre-amplifier 20a amplifies data applied through global data bus line pair GIOP, and inverter latch 20b latches the amplified data.

In clock cycle #b, transfer instruction signal OES0 is activated in synchronization with a rising of internal clock signal CLK, transfer circuit 20c is activated, and the data held by inverter latch 20b is transferred onto internal read data bus lines RDFL0 and /RDFL0. Thus, the first data a0 is read out to the internal read data bus. When the data transfer operation by transfer circuit 20c completes, pre-amplifier activation signal PAE0 is activated, pre-amplifier 20a amplifies the next data, which in turn is then latched by inverter latch 20b. The amplification and transfer of 128-bit memory cell data is performed simultaneously in a single memory array.

In clock cycle #b, during data transfer from transfer circuit 20c to internal read data bus lines RDFL0 and /RDFL0, transfer instruction signal RDGATE0 is activated in synchronization with a rising of internal clock signal CLK, transfer gate 30a conducts and transfers data on internal read data bus lines RDFL0 and /RDFL0, and inverter latch 30b latches the data on nodes RDL0 and /RDL0.

In clock cycle #c, a read command is applied and bank address BA specifies bank #1. In bank #1, a column selecting operation is performed according to a simultaneously applied address signal ADD(B), and selected memory cell data is transferred onto global data bus line pair GIOP. Subsequently, pre-amplifier activation signal PAE1 is activated to activate pre-amplifier 21a, which in turn amplifies the data on global data bus line pair GIOP, and inverter latch 21b latches the amplified data.

In this clock cycle #c, transfer instruction signal RDGATE0 is activated in response to a rising of clock signal CLK, and transfer gate 30a transfers data read out onto internal read data bus lines RDFL0 and /RDFL0 in response to activation of pre-amplifier activation signal PAE0 in synchronization with a rising of clock signal CLK in clock cycle #b, and to activation of transfer instruction signal OES0. Transfer instruction signal CLKOE0 is activated in synchronization with a rising of clock signal CLK, transfer gate 40a conducts to transfer the data latched by inverter latch 30b to inverter latch 40b. After (the CAS latency—1) cycle since a read command is applied, output activation signal OEM0 is activated in synchronization with a rising of dock signal CLK, and activated in clock cycle #c. Thus, main amplifier 40c is activated to transfer the data latched by inverter latch 40b to data bus line DBL.

In clock cycle #d, pre-amplifier activation signal PAE1 is activated, pre-amplifier 21a amplifies the next data, and inverter latch 21b latches the amplified data. In clock cycle #d, transfer instruction signal RDGATE1 is again activated in response to a rising of clock signal CLK1, transfer gate 31a conducts to transfer data on internal read data bus lines RDFL1 and /RDFL1 to inverter latch 31b, and inverter latch 31b latches the data on nodes RDL1 and /RDL1.

In clock cycle #d, transfer instruction signal CLKOE0 is also activated in synchronization with a rising of clock signal CLK, transfer gate 40a conducts and data is output to data bus line DBL through main amplifier 40c. Data a0 and a1 defined at a rising edge of clock signal CLK in clock cycles #d and #e and sampled by an external logic circuit are sequentially output from bank #0.

Meanwhile, in clock cycle #d, transfer instruction signal RDGATE1 is activated in synchronization with a rising of clock signal CLK, transfer gate 31a conducts to transfer the next data. Inverter latch 31b latches this new data.

In clock cycle #e, transfer instruction signal CLKOE1 is activated in synchronization with a rising of clock signal CLK, transfer gate 31b conducts, and the data latched by inverter latch 31b is transferred to inverter latch 41b. Output enable signal OEM1 is activated after (the CAS latency—1) clock cycle since a read command is applied. More specifically, in clock cycle #e, output activation signal OEM1 is activated. Thus, the data transferred to inverter latch 41b from transfer gate 41a is amplified by main amplifier 41c and then transferred onto data bus line DBL.

In clock cycle #e, transfer instruction signal OES1 is activated in synchronization with a rising of clock signal CLK, while transfer instruction signal RDGATE1 is activated in synchronization with a rising of clock signal CLK, and the next data b1 is transferred to inverter latch 31b.

Subsequently, in clock cycle #f, transfer instruction signal CLKOE1 is activated, transfer gate 41a conducts and the data latched by inverter latch 31b is transferred onto data bus line DBL through main amplifier 41c in an active state.

After a burst length period, these output activation signals OEM0 and OEM1 are inactivated. Therefore, in clock cycle #e, when reading of data from bank #0 completes, data from bank #1 is output, and data can be output from each of banks #0 and #1 without the collision of the data.

When output activation signals OEM0 and OEM1 are inactivated, main amplifiers 40c and 41c attain an output high impedance state.

Note that transfer instruction signal RDGATE (0,1) and transfer instruction signal CLKOE (0,1) are both activated in synchronization with a rising of clock signal CLK. However, since a certain period of time is required for data transfer, transfer instruction signal CLKOE (0,1) is inactivated before the data on nodes RDL (0,1) and /RDL (0,1) change, so that erroneous data reading can be prevented. Signal RDGATE may be driven to an H level after signal CLKOE attains an L level. By providing a pipeline stage to each of memory arrays (in the path from the pre-amplifier to the output circuit), the output activation signal can be selectively activated according to a bank address signal, so that data can be sequentially output from banks #0 and #1 without the collision of the data.

Figure 6:
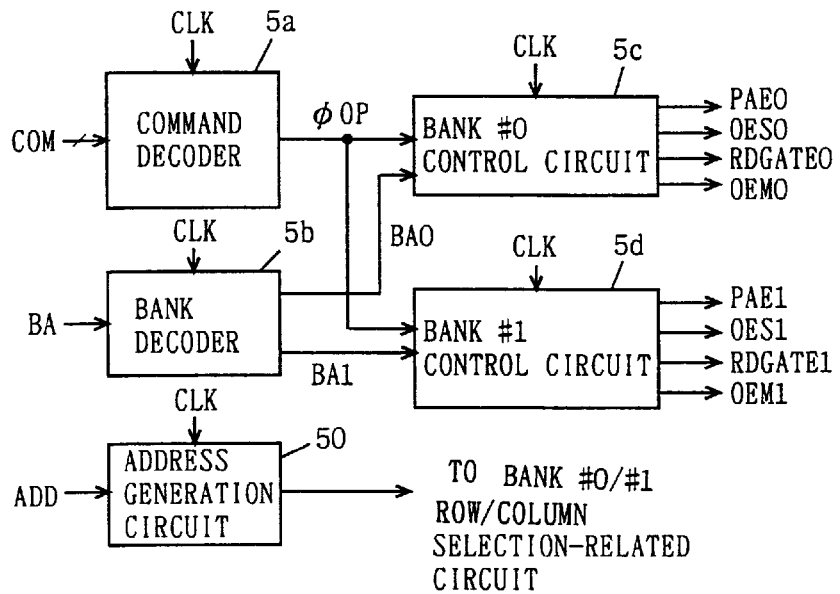
FIG. 6 is a schematic diagram showing the configuration of the control circuit shown in FIG. 2.

FIG. 6 is a schematic diagram of the configuration of control circuit 5 shown in FIG. 5. In FIG. 6, control circuit 5 includes a command decoder 5a which incorporates and decodes a command COM applied in synchronization with clock signal CLK and generates a signal φop instructing an operation mode specified by command COM, a bank decoder 5b which incorporates and decodes bank address signal BA in synchronization with internal clock signal CLK and outputs internal bank address signals BA0 and BA1, and a bank #0 control circuit 5c which receives operation mode instruction signal φop from command decoder 5a and bank specifying signal BA0 from bank decoder 5b, and generates a control signal necessary for the operation specified by operation mode instruction signal φop in synchronization with dock signal CLK, and a bank #1 control circuit 5d which receives operation mode instruction signal φop from command decoder 5a and bank address signal BA1 from bank decoder 5b and generates a control signal necessary for the specified operation mode in synchronization with internal dock signal CLK.

FIG. 6 shows the control signals related to data reading, in other words, pre-amplifier activation signals PAE0 and PAE1, transfer instruction signals OES0, OES1, RDGATE0 and RDGATE1, and output activation signals OEM0 and OEM1.

FIG. 6 also shows an address generation circuit 50 which generates an internal address signal from an address signal ADD applied in synchronization with clock signal CLK. Address generation circuit 50 generates internal row and column address signals from the applied address signals ADD according to an operation mode instruction signal from command decoder 5a and applies the signals to the row- and column-selection related circuits in banks #0 and #1. If the burst length is not less than 2, address generation circuit 50 includes a burst address counter which generates a burst address. If the burst length is 1, address generation circuit 50 includes an address buffer and an address latch.

As shown in FIG. 6, control circuits 5c and 5d are separately provided to banks #0 and #1, and therefore, banks #0 and #1 can be driven independently from each other according to a bank address.

Figure 7:
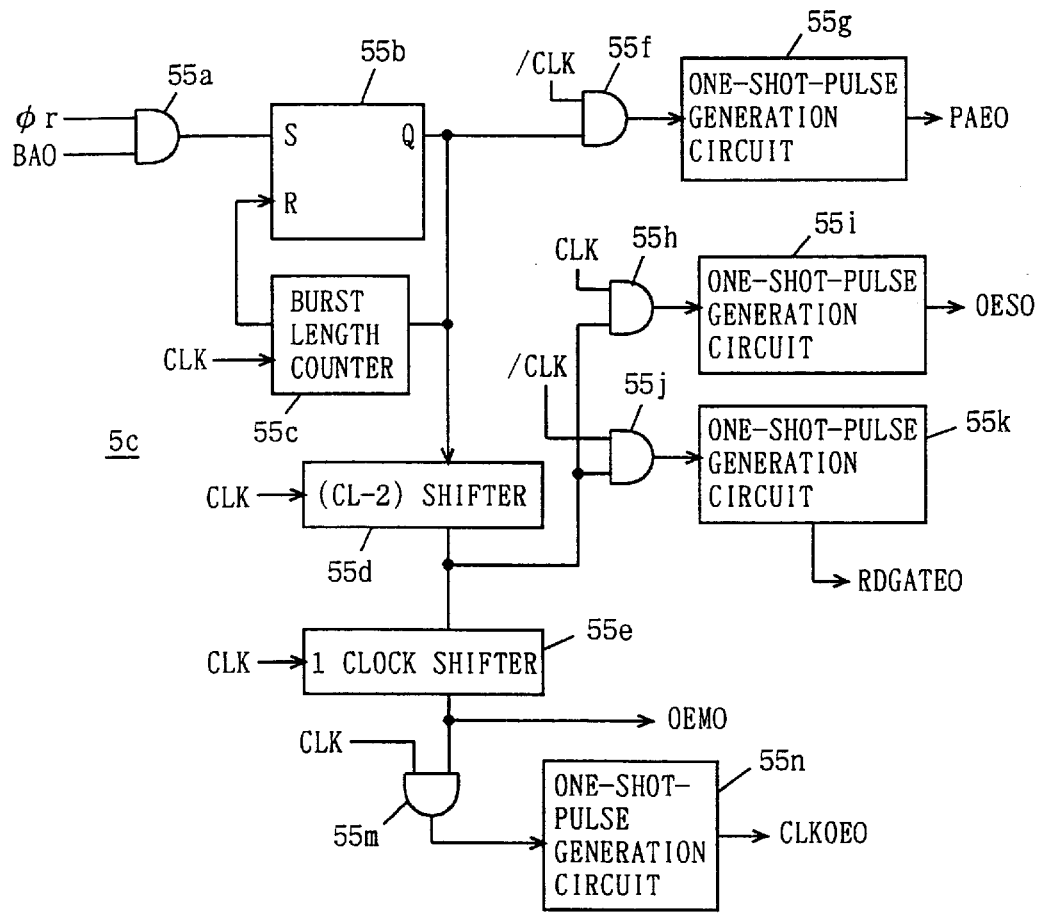
FIG. 7 is a schematic diagram showing the configuration of the bank #0 control circuit shown in FIG. 6.

FIG. 7 is a diagram specifically showing the structure of bank control circuits 5c and 5d. FIG. 7 shows a reading control portion for a single bank. In FIG. 7, since bank #0 control circuit 5c and bank #1 control circuit 5d have the same configuration, only the configuration of bank #0 control circuit 5c is schematically shown. The configuration of a bank #0 control circuit 5d can be implemented by using bank address signal BA1 and replacing the last number "0" with "1" of each output signal in the configuration in FIG. 7.

In FIG. 7, bank #0 control circuit 5c includes an AND circuit 55a which receives a reading operation instruction signal φr and a bank address signal BA0 to address bank #0, a set/reset flip-flop 55b set in response to a rising of the output signal of AND circuit 55a, a burst length counter 55c activated in response to a rising of the output signal of set/reset flip-flop 55b to count clock signal CLK, generate a countup signal when the count value reaches the value equal to the burst length and reset set/reset flip-flop 55b, a (CL-2) shifter 55d for shifting the output signal of set/reset flip-flop 55b by (CAS latency (CL)-2) clock cycles, and a 1-clock shifter 55b for further shifting clock signal CLK by one clock cycle period.

Burst length counter 55c is normally formed by a shifter performing a shifting operation in synchronization with clock signal CLK and causes a time delay equal to the burst length period. (CL-2) shifter 55d provides a delay of (CL-2) clock cycles to the output signal of set/reset flip-flop 55b. The 1-clock shifter 55e provides a time delay of 1 clock cycle of internal clock signal CLK to the output signal of (CL-2) shifter 55d.

Bank #0 control circuit 5c further includes an AND circuit 55f which receives the output signal of set/rest flip-flop 55b and clock signal CLK, a one-shot pulse generation circuit 55g which generates a one-shot pulse signal in response to a rising of the output signal of AND circuit 55f and generates pre-amplifier activation signal PAE0, an AND circuit 55h which receives the output signal of (CL-2) shifter 55d and internal clock signal CLK, a one-shot pulse generation circuit 55i which generates a one-shot pulse signal in response to a rising of the output signal of AND circuit 55h, an AND circuit 55j which receives an output signal of (CL-2) shifter 55d and clock signal CLK, and a one-shot pulse generation circuit 55k which generates a one-shot pulse signal in response to a rising of the output signal of AND circuit 55j. Output instruction signal OES0 is output from one-shot-pulse generation circuit 55i and output transfer instruction signal RDGATE0 is output from one-shot pulse generation circuit 55k.

Bank #0 control circuit 5c further includes an AND circuit 55m which receives the output signal of 1 clock shifter 55e and clock signal CLK, and a one-shot pulse generation circuit 55n which generates a one-shot pulse in response to a rising of the output signal of AND circuit 55m. The output signal of 1 clock shifter 55e is applied to the main amplifier as output activation signal OEM0. Transfer instruction signal CLKOE0 is output from one-shot pulse generation circuit 55n.

In the configuration in FIG. 7, if the CAS latency is 3, (CL-2) shifter 55d performs a shifting operation for 1 clock cycle. Therefore, when a data reading instruction to bank #0 is applied, the output signal of AND circuit 55a attains an H level, and set/reset flip-flop 55b is set. If a reading operation instruction to bank #0 is applied, pre-amplifier activation signal PAE0 is activated in response to a rising of clock signal CLK (after a prescribed time period since the rising of the clock signal). (CL-2) shifter 55d performs a shifting operation for 1 clock cycle, and therefore the output signal of (CL-2) shifter 55d attains an H level in the next cycle.

Therefore, in the cycle next to the clock cycle in which the reading operation instruction is applied, transfer instruction signal OES0 is activated in a prescribed timing in response to a rising of internal clock signal CLK and transfer instruction signal RDGATE0 is activated in a prescribed timing in response to a rising of internal clock signal CLK. Further in the next cycle, output activation signal OEM0 is activated, and transfer instruction signal CLKOE0 is activated.

One-shot pulse generation circuits 55g, 55i, 55k and 55n including delay circuits each generate a signal of an appropriate pulse width after a prescribed time period since activation of a corresponding trigger signal (the output of an AND circuit), and ensure accurate data transfer. After 2 clock cycles since a read command is applied to bank #0, the main amplifier outputs data, and the data from the main amplifier is sampled at a rising edge of clock signal CLK in the third clock cycle.

Burst length counter 55c counts a burst length period set in advance. If the burst length is 2, the output signal of set/reset flip-flop 55b holds an H level for a 2 clock-cycle period. If the burst length is 1, set/reset flip-flop 55b is reset in the cycle next to the cycle in which the read command is applied. Therefore, in this case, data accessing is made to bank #0 once.

Figure 8:
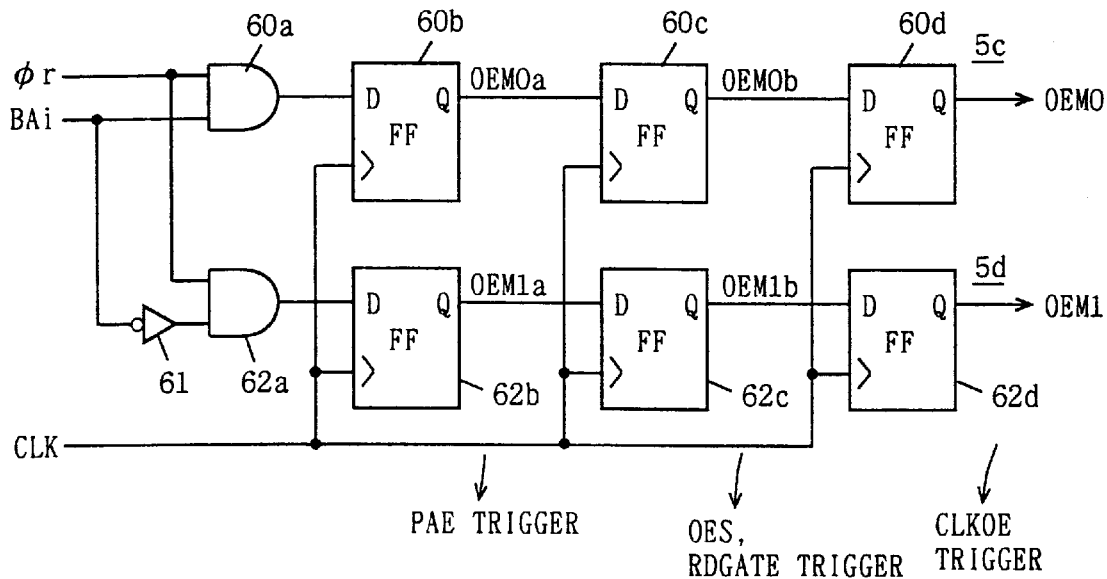
FIG. 8 is a schematic diagram showing the configuration of a variation of the bank #0 control circuit and the bank #1 control circuit shown in FIG. 6.

FIG. 8 is a diagram showing the configuration of a bank control circuit when the burst length is fixed to 1. FIG. 8 shows a portion generating output activation signals OEM and OEM1 to banks #0 and #1.

In FIG. 8, bank #0 control circuit 5c includes an AND circuit 60a which receives reading operation instruction signal φr activated when a read command is applied, and internal bank address signal BAi, a D flip-flop 60b which incorporates the output signal of AND circuit 60a in synchronization with a rising of clock signal CLK, a D flip-flop 60c which incorporates the output signal of flip-flop 60b in synchronization with a rising of clock signal CLK, and a D flip-flop 60d which incorporates the output signal OEM0b in synchronization with a rising of clock signal CLK. Output activation signal OEM0 is output from D flip-flop 60d.

Bank #1 control circuit 5d includes an inverter 61 which receives internal bank address signal BAi, an AND circuit 62 which receives the output signal of inverter 61 and reading operation instruction signal φr, a D flip-flop 62b which incorporates and latches the output signal of AND circuit 62a in synchronization with a rising of clock signal CLK, a D flip-flop 62c which incorporates and latches the output signal OEM1a of D flip-flop 62b in synchronization with a rising of clock signal CLK, and a D flip-flop 62d which incorporates and latches the output signal OEM1b of D flip-flop 62c in synchronization with a rising of clock signal CLK. D flip-flop 62d outputs output activation signal OEM1.

Figure 9:
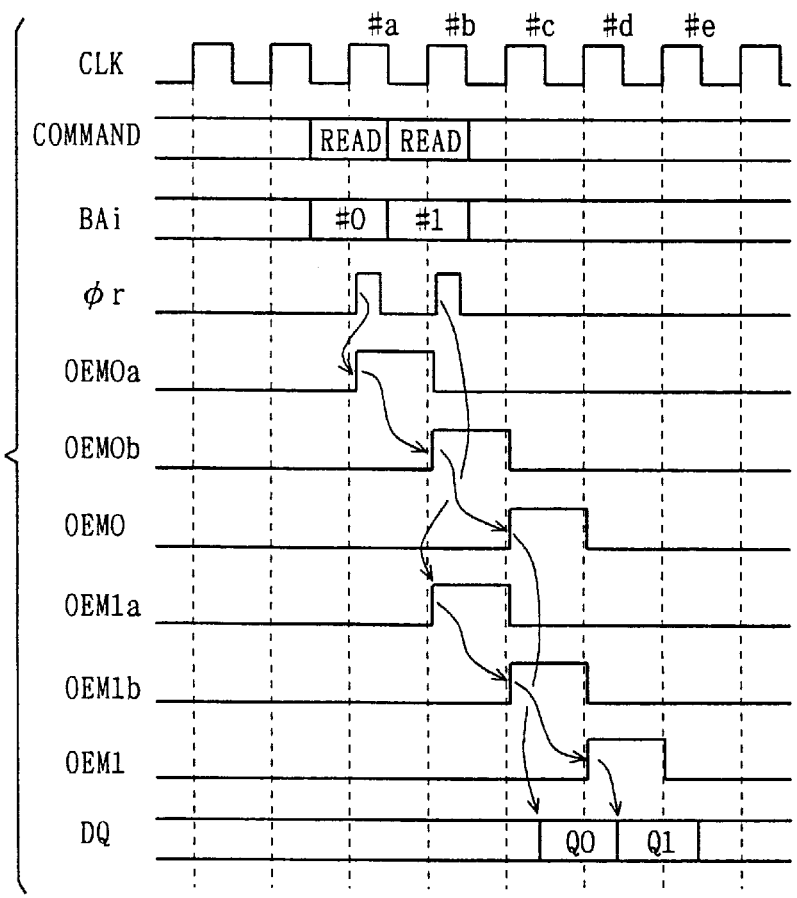
FIG. 9 is a timing chart representing the operation of the circuit shown in FIG. 8.

D flip-flops 60b to 60d and 62b to 62d each output a signal applied at a rising of clock signal CLK continuously for a 1 clock cycle period. The output signals OEM0a and OEM1a of D flip-flops 60b and 62b are used as triggers for activating pre-amplifier activation signals PAE0 and PAE1. The output activation signals OEM0b and OEM1b of D flip-flops 60c and 62c are used as trigger signals for transfer instruction signals OES (OES0, OES1) and RDGATE (RDGATE0 and RDGATE1). The output activation signals OEM0 and OEM1 from D flip-flops 60d and 62d are used for controlling activation of the main amplifiers. The operations of the bank control circuit shown in FIG. 8 will be described with reference to the timing chart in FIG. 9.

In clock cycle #a, a read command to instruct a data reading operation is applied. Bank address signal Ba is set to a state to specify bank #0, and internal bank address signal BAi is set to an H level. The read command causes reading operation instruction signal φr to be driven to an H level active state, and the output signal of AND circuit 60a attains an H level. In response to a rising of clock signal CLK, D flip-flop 60d incorporates an H level signal from AND circuit 60a and pulls output signal OEM0a to an H level. In D flip-flops 60c and 60d, signals applied to their inputs D at a rising of internal clock signal CLK are at an L level, and their output signals are maintained at the L level.

In clock cycle #b, a read command is applied, bank #1 is specified, and internal bank address signal BAi is set to an L level. When the output signal of inverter 61 attains an H level, and reading operation activation signal φr is activated by the read command, the output signal of AND circuit 62a attains an H level and the output signal of AND circuit 62a attains an H level, and the output signal OEM1a of D flip-flop 62b attains an H level.

In response to a rising of clock signal CLK, D flip-flop 60c incorporates the output signal OEM0a of D flip-flop 60b in synchronization with a rising of clock signal CLK, and the output signal OEM0b is pulled to an H level. At a rising of clock signal CLK, signal OEM0b is at an L level and output activation signal OEM0 maintains its L level.

When clock signal CLK rises in clock cycle #c, D flip-flop 60d raises the level of output enable signal OEM0 to an H level by the H level signal OEM0b. In response to the activation of output activation signal OEM0, transfer instruction signal CLKOE is activated and data from bank #0 is output.

In clock cycle #c, the output signal OEM1b of D flip-flop 62c attains an H level. Thus, transfer instruction signals OES1 and RDGATE1 are activated in bank #1, and data is transferred. At this time, output activation signal OEM1 output from D flip-flop 62d is still in an L level inactive state.

When clock signal CLK rises to an H level in clock cycle #d, D flip-flop 62d incorporates the H level signal OEM1b, and drives output activation signal OEM1 to an H level. Thus, data Q1 from bank #1 is read out.

When a read command is applied, reading operation instruction signal φr maintains an H level state only for a prescribed time period. Therefore, D flip-flops 60b to 60d and 62b to 62d maintain their output signals at an H level only for a 1 clock cycle period.

By using the bank control circuit shown in FIG. 8, data can be read in the state where the burst length is 1 and the CAS latency is 3.

Note that in the bank control circuit shown in FIG. 8, the CAS latency is 3, therefore three stages of D flip-flops are provided, and output activation signal OEM0/OEM1 is driven to an active state after the (CAS latency—1) clock cycle since the application of the read command. However, if the CAS latency is 2, the number of stages of the D flip-flops needs only be reduced by 1. In order to reduce the number of the stages, the number of stages of the D flip-flops may be changed using a selecting switch or the like based on the latency information.

In the configuration in FIG. 4, transfer instruction signals OES1 and OES2 may be maintained at an H level in a stand-by state and pulled to an L level when pre-amplifier activation signals PAE0 and PAE1 are activated. The inversed versions of pre-amplifier activation signals PAE0 and PAE1 may be used to generate these transfer instruction signals OES0 and OES1, so that the internal read data bus may be prevented from attaining an electrically floating state at the time of data transfer.

Figure 10:
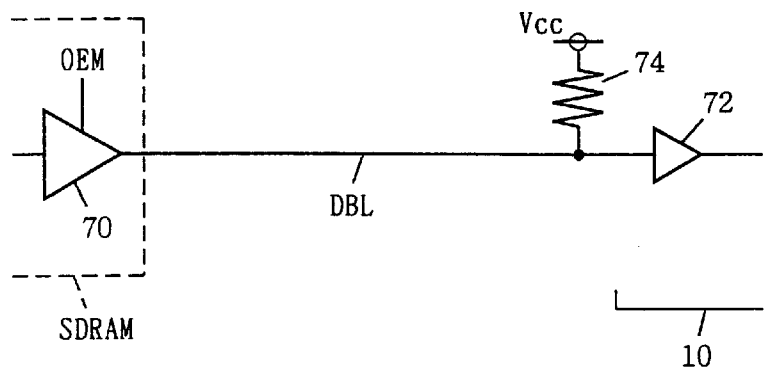
FIG. 10 is a diagram showing the configuration of a terminal of a bus line according to a second embodiment.

FIG. 10 is a schematic diagram showing the configuration of the input portion of logic circuit 10. In FIG. 10, the configuration of the 1-bit data input portion in logic circuit 10 is shown by way of illustration.

In FIG. 10, logic circuit 10 includes an input buffer (receiver) 72 which buffers a applied signal received through data bus line DBL. Input buffer 72 is formed by a CMOS circuit. A high resistance element 74 is connected between the input portion of input buffer (receiver) 72 and the power supply node. Resistance element 74 functions as a pull-up element.

Data bus line DBL is driven by a main amplifier 70 in a clock synchronous semiconductor memory device (SDRAM). Main amplifier 70 attains an output high impedance state when output activation signal OEM is inactivated. Input buffer 72 is in a high input impedance state. (In the CMOS circuit, the gate of the MOS transistor is coupled to data bus line DBL.) Therefore, a pull-up element 74 is provided to fix the input signal of input buffer 72 at an H level, so that the voltage level of data bus line DBL in the high impedance state may be prevented from becoming unstable and erroneous operations of input buffer (receiver) 72 or the flowing of through current may be prevented. Thus, the input signal of input buffer 72 can be fixed so that the power consumption can be lowered and erroneous operations can be prevented.

Figure 11:
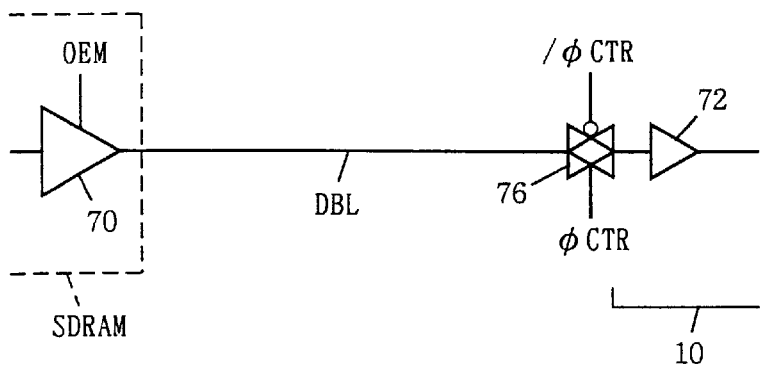
FIG. 11 is a schematic diagram showing a part of a terminal of a data bus line according to the second embodiment.

FIG. 11 is a diagram showing a variation of the input portion of the logic circuit. In the configuration shown in FIG. 11, data bus line DBL is coupled to input buffer (receiver) 72 in logic circuit 10 through a CMOS transmission gate 76. CMOS transmission gate 76 conducts when control signals φCTR and /φCTR are activated. Control signal φCTR is activated after the CAS latency following the application of a read command in logic circuit 10. Thus, data transmitted from main amplifier 70 is incorporated in synchronization with the clock signal. When main amplifier 70 attains an output high impedance state in response to inactivation of output activation signal OEM, CMOS transmission gate 76 is brought to a non-conductive state after the data transferred from main amplifier 70 is sampled. Thus, input buffer 72 is isolated from data bus line DBL, and will not be affected by the noise on data bus line DBL in the high impedance state, so that logic circuit 10 stably operates. Input buffer 72 may be formed by a tri-state buffer which attains an operative state when data is sampled.

As in the forgoing, according to the second embodiment of the present invention, a pipeline stage (from the pre-amplifier to the output circuit) is provided for each of memory arrays and a data bus is provided extending over the memory arrays and in common to a plurality of main amplifiers, so that the data bus width can be readily expanded without increasing the area occupied by the interconnection lines. The pipeline stages can be internally connected with each other by the interconnection lines in a different interconnection layer from that of the data bus line, which makes easier the interconnection lay out and the power supply can be easily reinforced.

Third Embodiment

Figure 12:
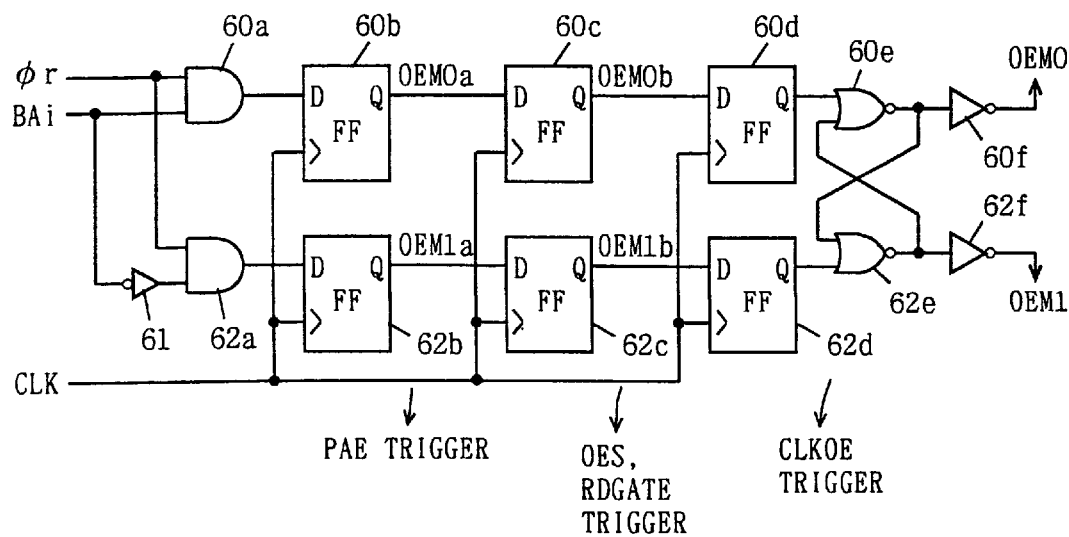
FIG. 12 is a diagram showing an essential part of a synchronous semiconductor memory device according to a third embodiment of the present invention.

FIG. 12 is a diagram showing a main part of a synchronous semiconductor memory device according to a third embodiment of the invention. In FIG. 12, the configuration of the output activation signal generation portion is shown. In the configuration of the output activation signal generation portion, in addition to the configuration shown in FIG. 8, there are provided a NOR circuit 60e which receives the output signal of a D flip-flop 60d at its fist input, a NOR circuit 62e which receives the output signal of a D flip-flop 62d at its first input, an inverter circuit 60f which inverts the output signal of NOR circuit 60e to generate an output activation signal OEM0, an inverter 62f which inverts the output signal of NOR circuit 62e to generate an output activation signal OEM1 for output. The output signal of NOR circuit 62e is coupled to a second input of NOR circuit 60e, and the output signal of NOR circuit 60e is applied to the second input of NOR circuit 62e. The other configuration is the same as that shown in FIG. 8 and the same reference numerals denote corresponding portions, and the description is not provided.

Figure 13:
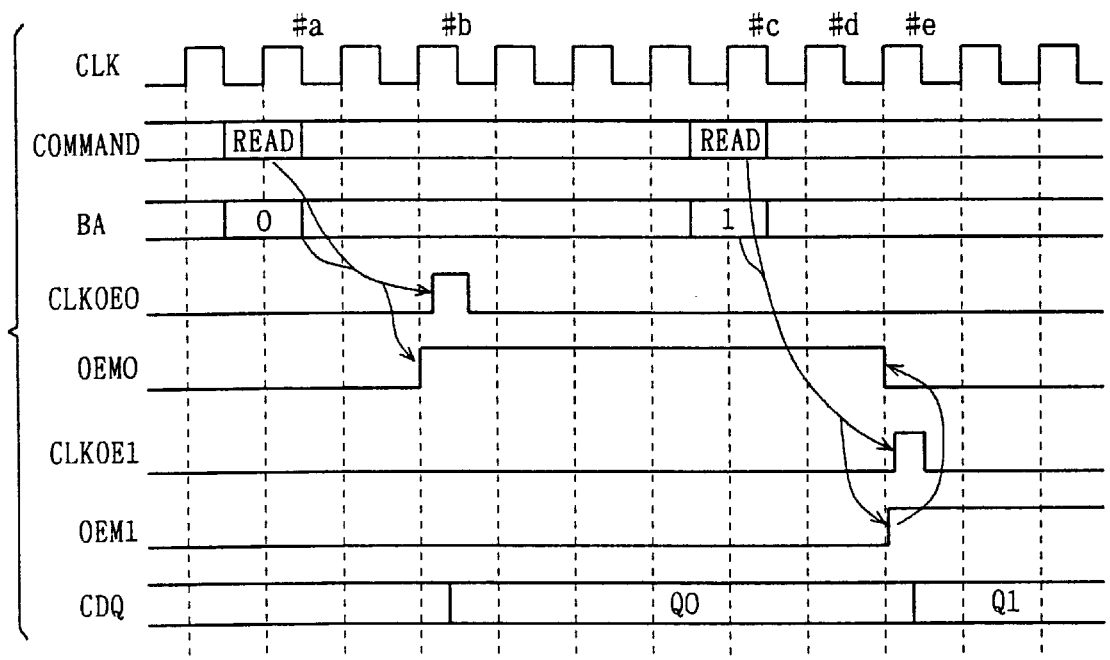
FIG. 13 is a timing chart representing the operations of the circuit in FIG. 12.

In the configuration in FIG. 12, NOR circuits 60e and 62e form a flip-flop. When the output signal of D flip-flop 60d attains an H level, the output signal of NOR circuit 60e attains an L level, and output activation signal OEM0 from inverter 60f is activated. When the output signal of D flip-flop 60d falls to an L level, NOR circuits 60e and 62e attain a latching state. Therefore, in this state, output activation signal OEM0 maintains its H level, data bus GDB is driven by the output circuit, and the same data is continuously output. This state is maintained until bank #1 is specified and the output signal of D flip-flop 62d rises to an H level. More specifically, if bank #1 is newly specified, the output signal of NOR circuit 62e attains an L level, the output signal of NOR circuit 60e attains an H level, and output activation signal OEM0 attains an L level, while output activation signal OEM1 attains an H level. The operations of the control circuit shown in FIG. 12 will be described with reference to the timing chart shown in FIG. 13.

In clock cycle #a, a read command to bank #0 is applied. When the CAS latency is 3, after 2 clock cycles since the application of the read command, the output signal of D flip-flop 60d attains an H level, and output activation signal OEM0 attains an H level. In response to a rising of the output signal of D flip-flop 60d, transfer instruction signal CLKOE0 attains an H level, and data is transferred from the latch circuit to the output circuit and data Q0 is read out. If the burst length is 1, transfer instruction signal CLKOE0 is activated only once. However, by the function of the NOR type flip-flop formed by NOR circuits 60e and 62e, output activation signal OEM0 is maintained at its H level if the output signal of D flip-flop 60d falls to an L level. During this period, data Q0 is continuously output from the output circuit.

In clock cycle #c, a read command to bank #1 is applied. In this state, in clock cycle #e after 2 clock cycles, the output signal of D flip-flop 62d attains an H level, output activation signal OEM0 is reset to an L level, and output activation signal OEM1 attains an H level. At this time, in response to a rising of the output signal of D flip-flop 62d, transfer instruction signal CLKOE1 attains an H level, and data Q1 from bank #1 is read out. After the data reading operation completes, by the function of NOR circuits 60e and 62e, output activation signal OEM1 is maintained at its H level, and data Q1 continues to be transferred to data bus GDB from the output circuit.

Therefore, by using the control circuit shown in FIG. 12, even if the synchronous semiconductor memory device is in a stand-by cycle, data is transmitted from the output circuit onto data bus GDB, and each data bus line DBL is fixed at an H level or an L level, which provides the following advantages.

Figure 14:
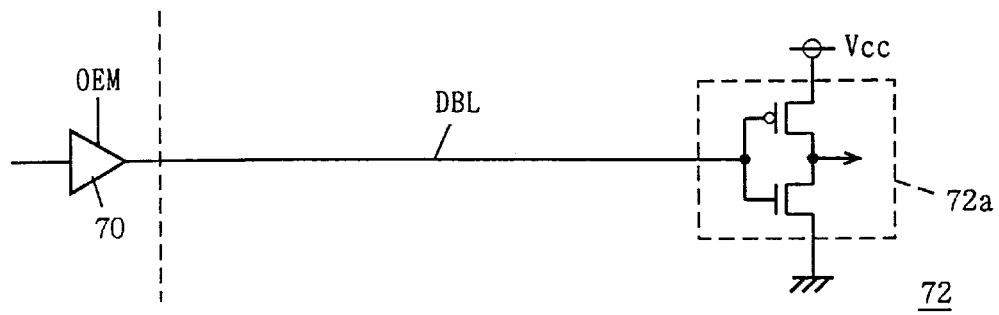
FIG. 14 is a diagram for use in illustration of the effects brought about by the circuit shown in FIG. 12.

FIG. 14 is a diagram showing an example of the configuration of an input buffer in a logic circuit. In FIG. 14, input buffer (receiver) 72 includes a CMOS inverter 72a in its first stage. CMOS inverter 72a includes a p channel MOS transistor and an n channel MOS transistor. These p channel MOS transistor and n channel MOS transistor have their gates coupled to data bus line DBL. When output activation signal OEM (OEM0, OEM1) is activated, data bus line DBL is fixed at an H or L level by main amplifier 70. CMOS inverter 72a does not consume current other than the time when its output signal changes. More specifically, through current or charge/discharge current flows when the output signal changes, but if the output signal is fixed at an H or L level, MOS transistors in CMOS inverter 72a are turned off and therefore almost no current is consumed. In main amplifier 70, data bus line DBL is also fixed to an H or L level, almost no current is consumed. Output activation signal OEM is at an H level after the data reading operation is over, and will not be inactivated until the next data reading is performed. Data from one of banks #1 and #0 continues to be output to data bus line DBL. Therefore, data bus line DBL will not attain a high impedance state. Thus, data bus line DBL can be directly coupled to CMOS inverter 72a, and the configuration of the input portion in the logic circuit can be simplified. Since a pull-up element is not necessary, the current consumption through the pull-up element can be reduced. A CMOS transmission gate for incorporating data as shown in FIG. 11 is not necessary, and the load of logic circuit 10 for the data incorporation can be alleviated.

Note that output activation signals OEM0 and OEM1, when activated, maintain an H level active state until another bank is accessed. Transfer instruction signals CLKOE0 and CLKOE1 are activated by the number of times equal to the burst length. This may be readily implemented by using the output signals of D flip-flops 60d and 62d shown in FIG. 12 as trigger signals for transfer instruction signals CLKOE0 and CLKOE1. As shown in FIG. 4, if transfer gates 40a and 41a are in a non-conductive state, data can be continuously and stably output by the function of inverter latches 40 and 41 included in output circuit 4#. Thus, data bus GDB will not be affected by noises, and data bus line DBL can be directly coupled to the input buffer in the logic circuit.

Modification

Figure 15:
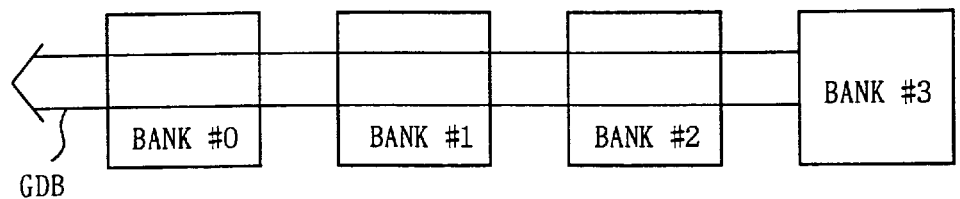
FIG. 15 is a diagram showing a bank arrangement for a variation of the third embodiment.

FIG. 15 is a diagram showing a modification of the third embodiment of the invention. In FIG. 15, 4 banks, bank #0 to #3 are provided in alignment along the column-direction. A data bus GDB is provided in common to these banks #0 to #3. Banks #0 to #3 each include a pipeline stage and a memory array. Control circuit 5 has a bank control circuit for each of banks #0 to #3. When any of these banks #0 to #3 is accessed, the output activation signal for the accessed bank is continuously maintained at an H level.

Figure 16:
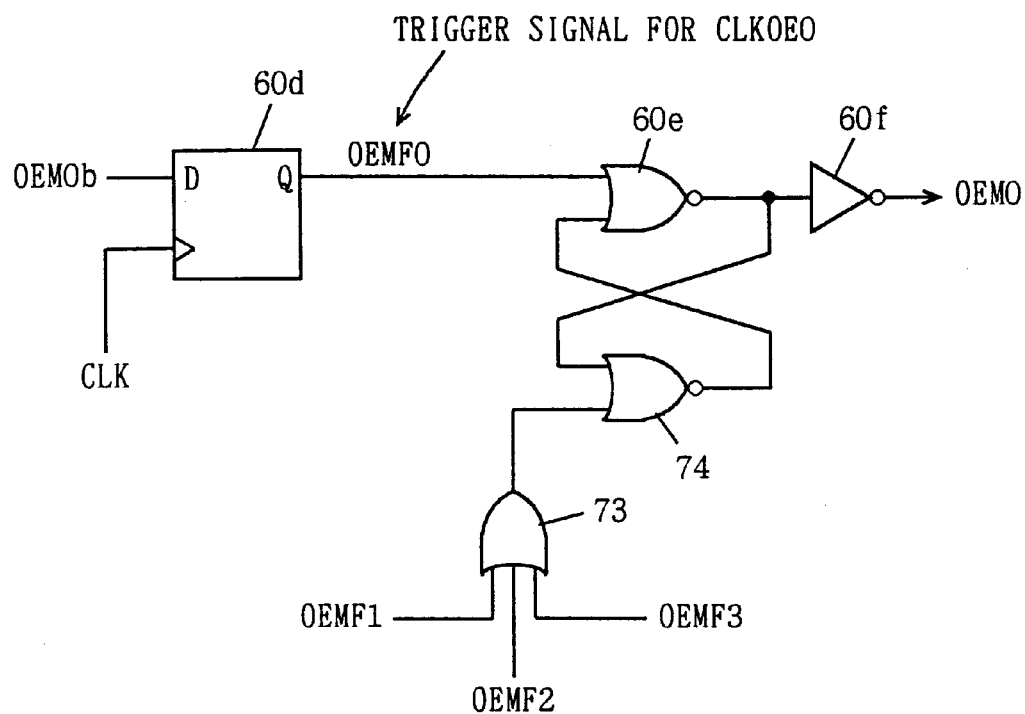
FIG. 16 is a schematic diagram showing the configuration of the variation of the third embodiment.

FIG. 16 is a diagram showing the configuration of an output control portion for the 4-bank arrangement. FIG. 16 shows a portion which generates output activation signal OEM0 to bank #0. Bank #0 circuit includes a NOR circuit 60e which receives the output signal OEMF0 of D flip-flop 60d at its first input, an inverter circuit 60f which inverts the output signal of NOR circuit 60e to generate output activation signal OEM0, an OR circuit 73 which receives output activation signals OEM1, OEM2 and OEM3 corresponding to banks #1 to #3, respectively, and a NOR circuit 74 which NORes output signals received from OR circuit 73 and NOR circuit 60e for application to the second input of NOR circuit 60e. The same configuration is provided for the other banks #1 to #3.

In the configuration shown in FIG. 16, D flip-flop 60d incorporates signal OEM0b from the D flip-flop in the preceding stage in synchronization with clock signal CLK, and outputs the signal as output activation signal OEMF0. According to signal OEMF, transfer instruction signal CLKOE0 is activated. NOR circuits 60e and 74 are set according to signal OEMF0, to set output activation signal OEM0 at an H level. In the other banks, in other words in banks #1 to #3, if any of output activation signals OEM1 to OEM3 is active, the active output activation signal is driven into an inactive state by the output signal of OR circuit 73 provided for each of the banks. Therefore, data from bank #0 is surely transmitted onto data bus GDB. If output signal OEMF0 attains an L level after the data transfer completes, signal OEM0 maintains its H level.

In this state, if any of banks #1 to #3 is accessed, according to activation of any of signals OEMF1 to OEMF3, the NOR type flip-flop formed by NOR circuits 60e and 74 is reset, and output activation signal OEM0 attains an L level inactive state.

Therefore, in the 4-bank arrangement, by the use of the configuration shown in FIG. 16, data from any of the banks in a stand-by cycle or data from the most recently accessed bank is continuously transmitted onto the data bus.

As in the foregoing, according to the third embodiment of the invention, data can be continuously transmitted from any of the plurality of banks onto the data bus, the signal on the data bus can be directly applied at the gate of the MOS transistor in this logic circuit. Current consumption will not increase at all in the input buffer (receiver) in a stand-by cycle when the buffer is formed by the CMOS inverter shown in FIG. 14.

Fourth Embodiment

Figure 17:
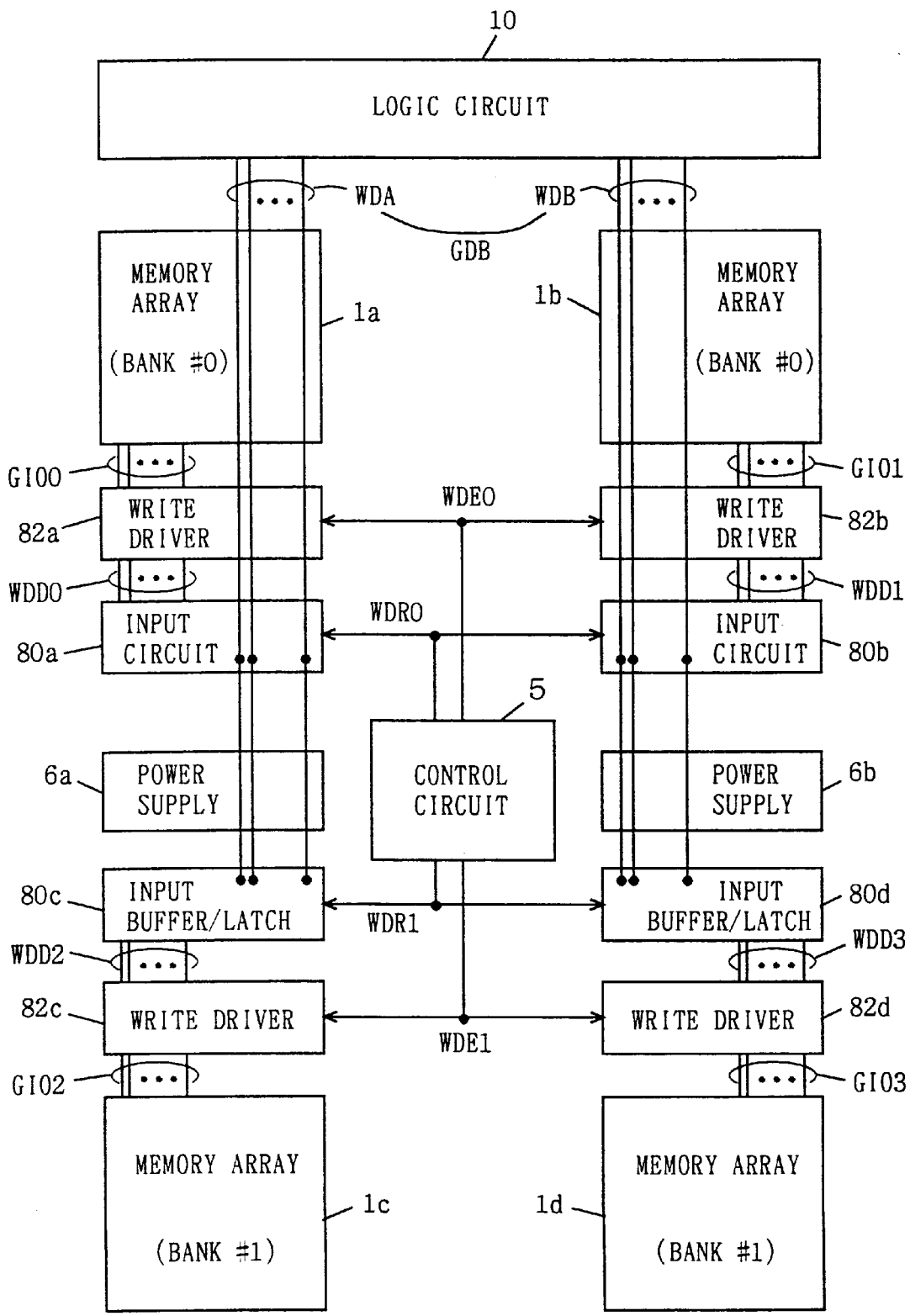
FIG. 17 is a schematic diagram showing the general configuration of a synchronous semiconductor memory device according to a fourth embodiment of the present invention.

FIG. 17 is schematic diagram of the general configuration of a synchronous semiconductor memory device according to a fourth embodiment of the invention. In FIG. 17, the clock synchronous semiconductor memory device includes 4 memory arrays 1a to 1d. Memory arrays 1a and 1b constitute bank #0, and memory arrays 1c and 1d constitute bank #1. Write driver 82a to 82d are coupled to memory arrays 1a to 1d through global data buses GIO0 to GIO3, respectively. Global data buses GIO0 to GIO3 each have a width of 128 bits as is the case with the above second embodiment, and is formed in the second aluminum interconnection layer.

Write drivers 82a to 82d are provided with input circuits 80a to 80d, respectively for inputting data. Input circuits 80a to 80d each include an input buffer which incorporates an applied signal in synchronism with the clock signal, and a latch circuit which receives and latches a signal applied from the buffer in response to a transfer instruction signal. Write drivers 82a to 82d and input circuits 80a to 80d are coupled by 128-bit data buses WDD0 to WDD3 formed in the second level aluminum interconnection layer, respectively.

Sub data buses WDA and WDB are provided extending in the column-direction over memory arrays 1a and 1b. Sub data buses WDA and WDB form data bus GDB and are provided in common to banks #0 and #1. Sub data bus WDA is coupled to input circuits 80a and 80c, while sub data bus WDB is coupled to input circuits 80b and 80d. Thus, logic circuit 10 transmits writing data to input circuits 80a and 80b or to input circuits 80c and 80d. Sub data buses WDA and WDB are formed in the third level aluminum interconnection layer.

A power supply circuit 6a is provided between input circuits 80a and 80c, and a power supply circuit 6b is provided between input circuits 80b and 80d.

In the central part, a control circuit 5 is provided to output control signals WDR0, WDR1, WDE0 and WDE1 to input circuits 80a to 80d and write drivers 82a to 82d.

A pipeline stage (a path formed by a write driver and an input circuit) is provided to each of the writing paths, so that the bus width may be readily expanded without increasing the area occupied by the buses. This is because data buses GIO and WDD are formed by the second level aluminum interconnection layer and sub data buses WDA and WDB are formed by the third level aluminum interconnection layer, as is the case with the second embodiment.

Figure 18:
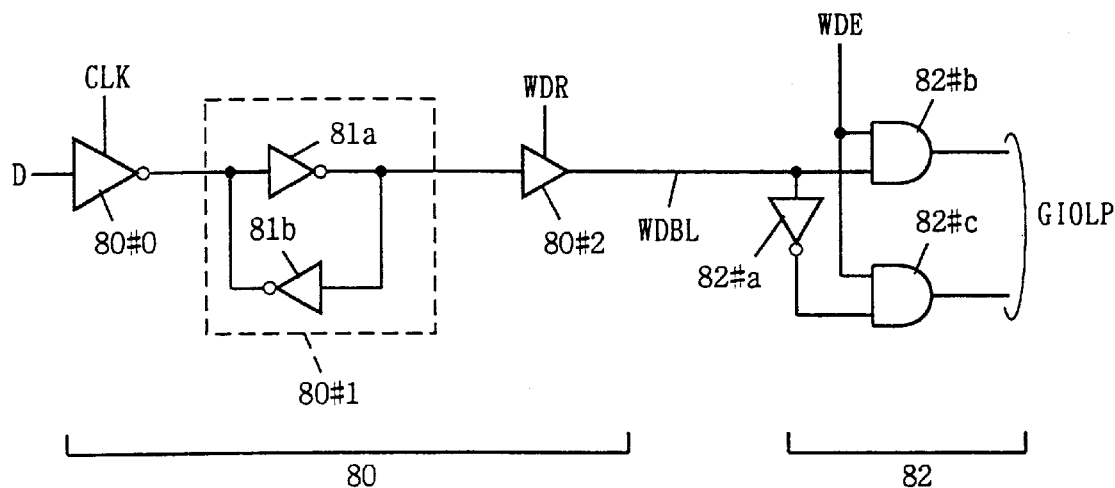
FIG. 18 is a diagram showing a writing portion of 1-bit data in the synchronous semiconductor memory device shown in FIG. 17.

FIG. 18 is a schematic diagram of the configuration of a writing pipeline stage for one memory array in the synchronous semiconductor memory device shown in FIG. 17. Input circuit 80 (80a to 80d) includes a tri-state inverter buffer 80#0 which passes externally applied data D in synchronization with clock signal CLK, a latch circuit 80#1 which latches the data from tri-state inverter buffer 80#0, and a transfer gate 80#2 which transfers the data latched by latch circuit 80#1 to a write driver 82 in response to transfer instruction signal WDR. Latch circuit 80#1 includes an inverter 81a which inverts a signal from tri-state inverter buffer 80#0, and an inverter 81b which inverts the output signal of inverter 81a for transfer to the input portion of inverter 81a. Transfer gate 80#2 is formed by a tri-state buffer which operates in response to transfer instruction signal WDR activated when a write command is applied.

Write driver 82 includes an inverter 82#a which inverts data applied through data bus line WDBL via transfer gate 80#2, an AND circuit 82#b which receives write driver activation signal WDE and a signal on data bus line WDBL, and an AND circuit 82#c which receives the output signal of inverter 82#a and write driver activation signal WDE. AND circuits 82#b and 82#c drive a global data bus line pair GIOLP based on applied data.

In the writing path (pipeline stage) shown in FIG. 18, in response to a rising of internal clock signal CLK, inverter buffer 80#0 operates, and externally applied data is latched by latch circuit 80#1. Subsequently, in a data writing mode, transfer instruction signal WDR (WDR0 or WDR1) is activated according to a bank address, and the data latched in latch circuit 80#1 is transferred onto data bus line WDBL. Then, when the data transferred onto this data bus line WDBL reaches the write driver, write driver activation signal WDE (WDE0 or WDE1) is activated, and the data is written into a selected memory cell through global data bus line pair GIOLP.

In the configuration shown in FIG. 18, transfer gate 80#2 may be formed by a CMOS transmission gate.

In the writing circuit, provision of a pipeline stage (a write driver and an input circuit) transference of data according to transfer instruction signal WDR and a write driver activation signal allows a data bus to be provided in common to a plurality of banks to input data.

Note that sub data buses WDA and WDB may or may not be the same data buses as sub data buses RDA and RDB. In other words, sub data buses WDA and WDB for transferring writing data and sub data buses RDA and RDB for transferring reading data may be separately provided.

Modification

Figure 19:
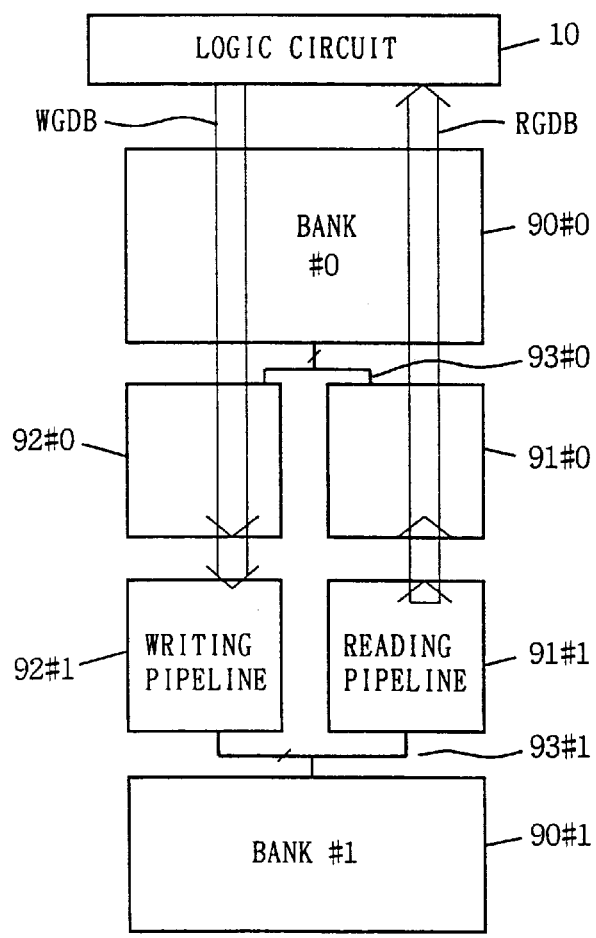
FIG. 19 is a schematic diagram showing the configuration of a variation of the fourth embodiment.
Figure 20:
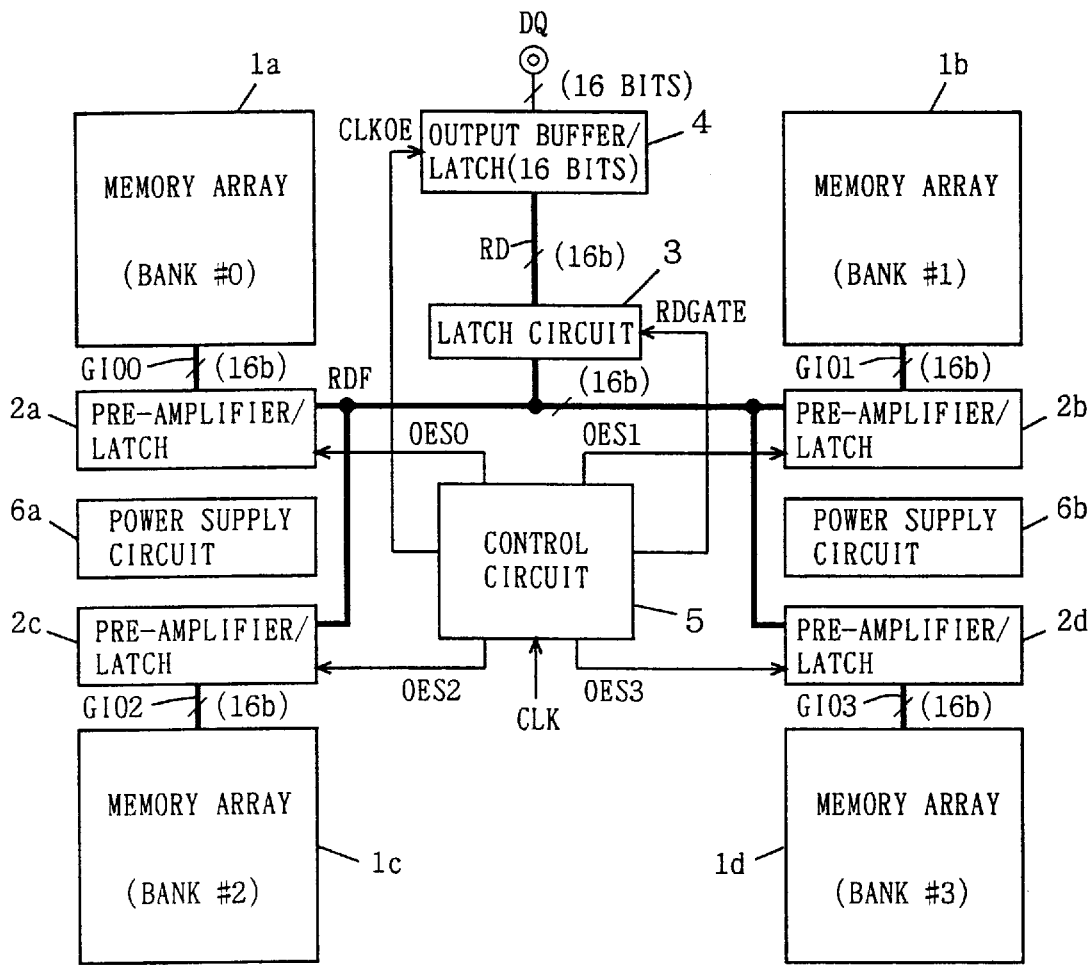
FIG. 20 is a schematic diagram showing the configuration of a conventional synchronous semiconductor memory device.
Figure 21:
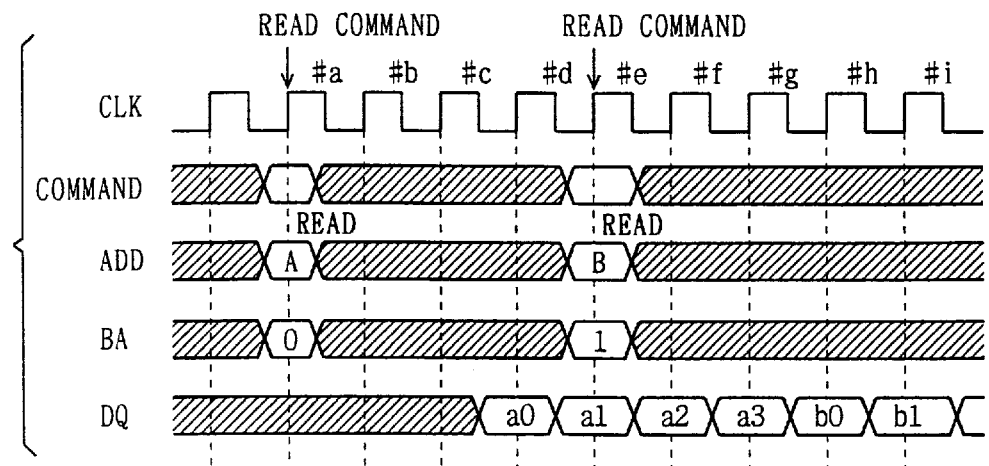
FIG. 21 is a timing chart for use in illustration of the operations of the synchronous semiconductor memory device shown in FIG. 20.

FIG. 19 is a schematic diagram showing a modification of the fourth embodiment of the present invention. In FIG. 19, the synchronous semiconductor memory device includes a memory array 90#0 constituting a bank #0 and a memory array 90#1 constituting a bank #1, a reading pipeline 91#0 and a writing pipeline 92#0 for exchanging data with bank #0 through a global data bus 93#0, a reading pipeline 91#1 receiving reading data from bank #1 and transferring the received data and a writing pipeline 92#1 for transferring writing data to bank #1 through global data bus 93#1. Reading data bus RGDB for transferring reading data is formed over memory array 90#0 constituting bank #0, while writing data bus WGDB for transferring writing data from logic circuit 10 is provided parallel to reading data bus RGDB. The reading data bus RGDB is coupled to reading pipeline stages 91#0 and 91#1, and writing data bus WGDB is coupled to writing pipeline stages 92#0 and 92#1.

In the configuration shown in FIG. 19, the writing data bus and reading data bus are provided separately. Therefore, although the number of data bus lines increases, since the data buses are provided over the memory array 90#0 constituting the bank, the writing and reading data buses having bus widths expanded can be readily provided without increasing the area occupied by the interconnection lines. By separately providing the writing data bus and reading data bus, writing data can be transferred to writing data bus WGDB while reading data is transferred on to reading data bus RGDB.

Reading pipelines 91#0 and 91#1 include each circuit from the pre-amplifier circuit to the output circuit, and writing pipeline stages 92#0 and 92#1 include an input buffer, a latch circuit, and a write driver.

The arrangement of each circuit in the reading pipeline stages and writing pipeline stages is arbitrary in one bank. A pre-amplifier, a write driver, a latch circuit, an input circuit, and an output circuit may be aligned in a line. In the aligned arrangement, empty spaces are present in the circuit arrangement region, and internal data buses may be provided in the empty spaces using the second level aluminum interconnection layer.

As in the foregoing, according to the fourth embodiment of the invention, since a pipeline stage is provided for each of the memory arrays in a data writing path, the data bus width can be readily expanded without increasing the area occupied by the interconnection lines.

Other Applications

In the above embodiments, the Synchronous Dynamic Random Access Memory (SDRAM) is used as the synchronous semiconductor memory device. However, the present invention is applicable to any memory device which transfers data in synchronization with a clock signal.

Furthermore, in the above embodiments, the multi-bank synchronous semiconductor memory device is described. However, a single-bank synchronous semiconductor memory device may be used. The invention is applicable if memory cells are simultaneously selected in memory arrays aligned in the column-direction for data accessing.

In addition, the clock signal may be internally generated in synchronization with an externally applied clock signal and applied to a logic circuit and a memory, or may be applied from the logic circuit to the memory.

As described above, according to the present invention, a synchronous semiconductor memory device which allows the bus width to be readily expanded without increasing the area occupied by buses can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device, comprising:

a plurality of memory arrays arranged in a matrix of rows and columns, each of the memory arrays including a plurality of memory cells arranged in a matrix of rows and columns;

a plurality of pre-amplifier circuits provided corresponding to said plurality of memory arrays for amplifying data read out from a memory cell selected in a corresponding memory array;

a plurality of read transfer circuits provided corresponding to said plurality of pre-amplifier circuits for transferring data amplified by a corresponding pre-amplifier circuit in synchronization with a clock signal;

a data bus provided in common to said plurality of memory arrays, said data bus including a plurality of sub data buses provided in common to memory arrays aligned along one of the row- and column-directions of said plurality of memory arrays and extending in the one direction over at least one of corresponding memory arrays; and a plurality of output circuits provided corresponding to said plurality of read transfer circuits, each of the output circuits receiving data from a corresponding read transfer circuit for transmission to said data bus.

2. The synchronous semiconductor memory device as recited in claim 1, wherein said plurality of read transfer circuits are provided corresponding to said plurality of memory arrays, and said output circuits are provided corresponding to said plurality of memory arrays, and each of the output circuits transmits data to a corresponding sub data bus when activated.

3. The synchronous semiconductor memory device as recited in claim 1, further comprising control circuitry configured to be responsive to a memory array specifying signal for activating a pre-amplifier circuit, a read transfer circuit, and an output circuit provided corresponding to a selected memory array specified by said memory array specifying signal in synchronization with said clock signal.

4. The synchronous semiconductor memory device as recited in claim 3, wherein said control circuitry includes a circuit for maintaining the output circuit provided corresponding to said selected memory array in an active state until another memory array is specified after accessing to the selected memory array specified by said memory array specifying signal is completed.

5. The synchronous semiconductor memory device as recited in claim 4, wherein each of the output circuits includes a latch circuit for latching applied data, and each of the output circuits outputs data held by said latch circuit onto a corresponding sub data bus when activated.

6. The synchronous semiconductor memory device as recited in claim 1, wherein each of the output circuits is set to an output high impedance state when inactivated.

7. The synchronous semiconductor memory device as recited in claim 6, wherein said plurality of sub data buses each include a data line for transferring data, said data line being isolated from a receiver for receiving said data on said data line in a standby cycle.

8. The synchronous semiconductor memory device as recited in claim 1, further comprising:

a plurality of input circuits provided corresponding to said plurality of memory arrays for generating internal writing data in synchronization with said clock signal when activated;

a plurality of write transfer circuits provided corresponding to the input circuits for transferring data from a corresponding input circuit in synchronization with said clock signal; and a plurality of write drivers provided corresponding to the write transfer circuits for transferring data from a corresponding transfer circuit to a selected memory cell in a corresponding memory array.

9. The synchronous semiconductor memory device as recited in claim 8, further comprising, a write data bus provided in parallel to and separately from said data bus and coupled in common to said plurality of input circuits for transferring writing data, said write data bus including a plurality of sub data buses each provided in common to memory arrays aligned in said one direction and extending in said one direction over at least one memory array of corresponding memory arrays.

10. The synchronous semiconductor memory device as recited in claim 1, wherein said plurality of memory arrays constitute a plurality of banks, and memory arrays sharing said sub data bus constitute different banks.

11. The synchronous semiconductor memory device as recited in claim 3, wherein said control circuitry includes a circuit for maintaining one of output circuits sharing a sub data bus among said plurality of output circuits in an active state when said synchronous semiconductor memory device is in a stand-by cycle.

12. The synchronous semiconductor memory device as recited in claim 8, further comprising a control circuit for activating an input circuit, a write transfer circuit and a write driver provided corresponding to a selected memory array specified in response to a memory array specifying signal in synchronization with said clock signal.

13. A synchronous semiconductor memory device, comprising:

a plurality of memory arrays arranged in a matrix of rows and columns, each of the memory arrays including a plurality of memory cells arranged in a matrix of rows and columns;

a data bus provided in common to said plurality of memory arrays, said data bus including a plurality of sub data buses provided in common to memory arrays aligned along one of the row- and column-directions of said plurality of memory arrays and extending in the one direction over at least one of corresponding memory arrays;

a plurality of input circuits provided corresponding to said plurality of memory arrays and coupled to corresponding sub data buses for generating internal writing data in accordance with data transferred through the corresponding sub data buses in synchronization with a clock signal when activated;

a plurality of write transfer circuits provided corresponding to the input circuits for transferring data from a corresponding input circuit in synchronization with said clock signal; and a plurality of write drivers provided corresponding to the write transfer circuits for transferring data from a corresponding write transfer circuit to a selected memory cell in a corresponding memory array.

14. The synchronous semiconductor memory device as recited in claim 13, wherein said plurality of memory arrays constitute a plurality of banks, and memory arrays sharing said sub data bus constitute different banks.

15. The synchronous semiconductor memory device as recited in claim 13, further comprising a control circuit for activating an input circuit, a write transfer circuit and a write driver provided corresponding to a selected memory array specified in response to a memory array specifying signal in synchronization with said clock signal.

16. The synchronous semiconductor memory device as recited in claim 1, further comprising power source circuits each arranged between memory arrays aligned in the one direction, for generating an internal voltage used in said synchronous semiconductor memory device.

17. The synchronous semiconductor memory device as recited in claim 13, further comprising power source circuits each arranged between memory arrays aligned in the one direction, for generating an internal voltage used in said synchronous semiconductor memory device.

* * * * *